(12) United States Patent
Khater et al.

(10) Patent No.: US 7,288,829 B2
(45) Date of Patent: Oct. 30, 2007

(54) BIPOLAR TRANSISTOR WITH SELF-ALIGNED RETROGRADE EXTRINSIC BASE IMPLANT PROFILE AND SELF-ALIGNED SILICIDE

(75) Inventors: Marwan H Khater, Poughkeepsie, NY (US); Francois Pagette, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,437

(22) Filed: Nov. 10, 2004

(65) Prior Publication Data

US 2006/0097350 A1 May 11, 2006

(51) Int. Cl.
*H01L 29/73* (2006.01)
(52) U.S. Cl. ............... 257/592; 257/E29.184; 257/E29.182; 257/E29.183; 257/587; 438/366; 438/374; 438/376
(58) Field of Classification Search ............... 257/587, 257/592, 558, E29.182, E29.183, E29.184; 438/343, 366, 374, 376
See application file for complete search history.

(56) References Cited

U.S. PATENT DOCUMENTS

| | | | | |
|---|---|---|---|---|
| 5,302,535 A | * | 4/1994 | Imai et al. ............... | 438/350 |
| 5,428,243 A | * | 6/1995 | Wylie ...................... | 257/592 |
| 5,656,514 A | | 8/1997 | Ahlgren et al. | |
| 6,239,477 B1 | * | 5/2001 | Johnson ................... | 257/592 |
| 6,531,720 B2 | | 3/2003 | Freeman et al. | |
| 6,534,372 B1 | | 3/2003 | Racanelli | |
| 6,551,891 B1 | * | 4/2003 | Chantre et al. ............. | 438/343 |
| 6,846,710 B2 | * | 1/2005 | Yi et al. ................... | 438/202 |
| 2002/0153535 A1 | | 10/2002 | Freeman et al. | |
| 2003/0082882 A1 | * | 5/2003 | Babcock et al. ............ | 438/309 |

* cited by examiner

*Primary Examiner*—Zandra V. Smith
*Assistant Examiner*—Tsz K. Chiu
(74) *Attorney, Agent, or Firm*—Gibb & Rahman, LLC; Ira D. Blecker, Esq.

(57) ABSTRACT

Disclosed is a method of forming a transistor in an integrated circuit structure that begins by forming a collector in a substrate and an intrinsic base above the collector. Then, the invention patterns an emitter pedestal for the lower portion of the emitter on the substrate above the intrinsic base. Before actually forming the emitter or associates spacer, the invention forms an extrinsic base in regions of the substrate not protected by the emitter pedestal. After this, the invention removes the emitter pedestal and eventually forms the emitter where the emitter pedestal was positioned.

14 Claims, 57 Drawing Sheets

BIPOLAR TRANSISTOR WITH SELF-ALIGNED RETROGRADE EXTRINSIC BASE IMPLANT PROFILE AND SELF-ALIGNED SILICIDE

FIELD OF THE INVENTION

This invention relates to self-aligned bipolar transistor (BT) for which the extrinsic base implant, extrinsic base silicide, and the emitter are self-aligned to one another.

DESCRIPTION OF THE RELATED ART

It has been shown that introducing a SiGe epitaxial layer to serve as the base of a bipolar transistor allows the bipolar transistor to achieve high switching speeds. By reducing the parasitic base resistance and capacitance, one can take advantage of the speed increase to further increase in the maximum oscillation frequency (fmax). One easy approach to accomplish this goal is to reduce the lateral dimensions of the transistor. Aligning one part of the transistor to another is traditionally done by lithography. In designing such a structure one must consider the alignment and critical dimension tolerance associated with the lithography processes. Integration schemes that make use of self-alignment instead of lithography, where of one part of the transistor is used to align another feature of the transistor, have proven to be efficient in reducing the lateral dimensions and increasing transistor performance.

For a conventional bipolar transistor, the extrinsic base layer is implanted after the patterning of the emitter polysilicon layer. These conventional patterning processes still rely on lithography to align the emitter polysilicon layer pattern to the emitter opening and the subsequent contact. The emitter polysilicon layer pattern is typically large enough to allow for tolerance in the lithographic processes for the emitter contact. Therefore, for this type of integration scheme, the extrinsic base implant and silicide are non-self aligned and are spaced far away from the emitter base junction, which results in high base resistance. The maximum oscillation frequency of such a non-self aligned transistor is limited by a base resistance (Rb) caused by such spacing.

The below-referenced U.S. patents disclose embodiments that were satisfactory for the purposes for which they were intended. The disclosures of the below-referenced prior U.S. patents, in their entireties, are hereby expressly incorporated by reference into the present invention for purposes including, but not limited to, indicating the background of the present invention and illustrating the state of the art.

For example, in U.S. Pat. No. 6,534,372, the extrinsic base is delimitated by a permanent spacer formed around a temporary emitter pedestal or by the temporary emitter pedestal itself. The temporary pedestal is later removed by lithography and etching to be replaced by a polysilicon emitter. The permanent spacer must then be of sufficient width for the second lithographic pattern edge with its associated critical dimensions (CD) and alignment tolerance to be formed on top of the spacer. In addition, the spacer width has to be sufficient to provide emitter-base isolation. This adds a structural constraint on the emitter dimension and minimum distance between the heavy doped extrinsic base area and the emitter-base junction. Also, the emitter polysilicon layer and the extrinsic base silicide are defined by lithography which adds to the lateral dimension and base resistance.

In U.S. patent application Ser. No. 6,531,720, the lateral profile of the extrinsic base doping is determined by a dual spacer formed around a temporary emitter pedestal. The emitter polysilicon layer and the extrinsic base silicide are defined by lithography which adds to the lateral dimension and the base resistance. Another drawback of this integration scheme is that the temporary pedestal lays on top of a thick stack of oxide nitride and polysilicon layers. In this case, the stack is needed to later form the emitter-base isolation and, consequently, the dopant implantation through such a thick stack have to be of high energy to achieve low base resistance in the extrinsic base region. This results in less control over the doping profile and loss of intrinsic base region due to dopant diffusion.

SUMMARY OF THE INVENTION

The invention presents a method of forming a transistor in an integrated circuit structure that begins by forming a collector in a substrate and then forming an intrinsic base above the collector. The invention patterns an alignment layer over the substrate to have an alignment opening and then patterns an emitter pedestal (sacrificial placeholder) on the substrate in the alignment opening. Then, the invention can perform a first implant to form first extrinsic base portions in regions of the substrate not protected by the emitter pedestal and the alignment layer. Next, the invention removes the emitter pedestal and forms an emitter in the alignment opening, which is self-aligned to the first extrinsic base implant. After removing the alignment layer, the invention performs a second implant to form second extrinsic base portions in regions of the substrate not protected by the emitter. Then, sidewall spacer is formed on the emitter and a third implant is performed to form third extrinsic base portions in regions of the substrate not protected by the emitter and the sidewall spacer.

Similarly, the process of forming the emitter comprises depositing an emitter material conformally within the alignment opening. The thickness of the emitter material within the alignment opening determines the width of the emitter. This conformal deposition process again leaves a recess in the emitter material where the alignment opening is positioned. As was done with the emitter pedestal, a mask is formed within the recess the emitter material not protected by the mask is removed.

In another embodiment, the invention forms a collector in a substrate and an intrinsic base above the collector. Then, the invention patterns an emitter pedestal for the lower portion of the emitter on the substrate above the intrinsic base. Before actually forming the emitter or associates spacers, the invention forms an extrinsic base in regions of the substrate not protected by the emitter pedestal. After this, the invention removes the emitter pedestal and eventually forms the emitter where the emitter pedestal was positioned.

This embodiment provides a process of forming the extrinsic base that first performs a first impurity implant into the regions of the substrate not protected by the emitter pedestal, without any spacers present. This allows the sides of the extrinsic base regions to be directly vertically below and directly vertically aligned with sides of the lower portion of the emitter. After this first implant, the invention then forms first sidewall spacer on the emitter pedestal and performs a second impurity implant into regions of the substrate not protected by the emitter pedestal or the first sidewall spacer. The invention then removes the first sidewall spacer and repeats the implant process with a wider sidewall spacer. Therefore, the invention forms second sidewall spacer on the emitter pedestal. These second sidewall spacers extend further from the emitter pedestal than did the first sidewall spacer. Then, the invention performs a third impurity implant into regions of the substrate not protected by the emitter pedestal or the second sidewall spacer.

This processing causes the extrinsic base to include multiple steps adjacent the sides of the emitter when viewed in cross-section. These steps comprise lengths of the extrinsic base that extend different depths into the substrate, wherein each successive length of the extrinsic base away from the emitter and the intrinsic base extend further into the substrate. Also, the thickness of the first sidewall spacer and the second sidewall spacer is independent of the thickness of the isolation regions that will be formed adjacent the lower portion of the emitter later.

Before the invention removes the emitter pedestal, it forms an alignment layer adjacent the emitter pedestal. When the emitter pedestal is removed, this leaves an emitter opening in the alignment layer. Then, the subsequent processing forms the emitter in the emitter openings of the alignment layer. Also, the invention forms an etch stop layer on the substrate and the thickness of the etch stop layer is controlled to reduce the energy required for the process of forming the extrinsic base regions.

The resulting structure has a collector and intrinsic base in the substrate, extrinsic base regions in the substrate adjacent the intrinsic base, and an emitter above the intrinsic base. The emitter has a T-shape where the upper portion is wider than the lower portion. The sides of the extrinsic base regions can be directly vertically below and directly vertically aligned with the sides of a lower portion of the emitter that is directly above the intrinsic base, or can be positioned below the emitter. These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF THE INVENTION

Figure 1:
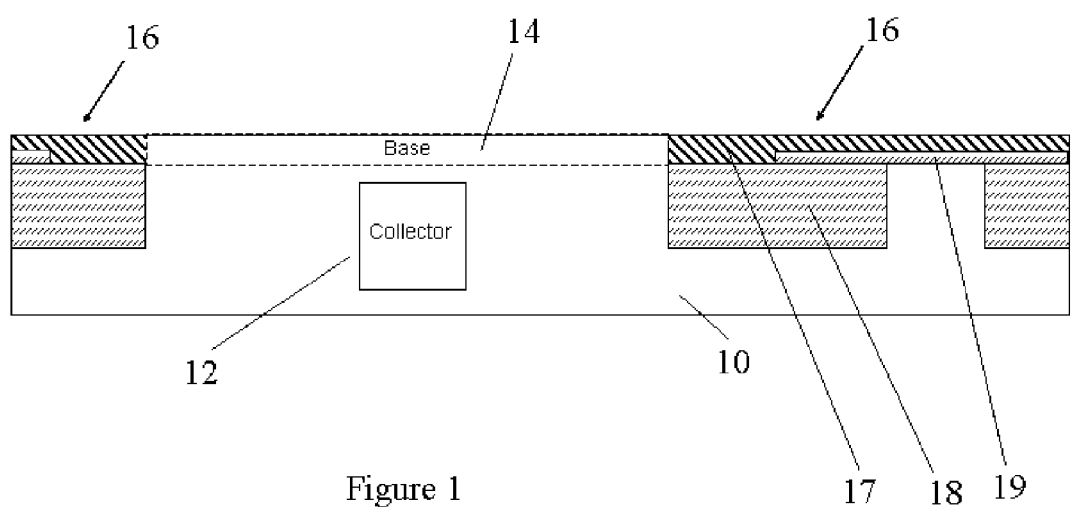
FIG. 1 is a schematic diagram of a partially completed bipolar transistor according to the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The various solutions toward improving bipolar transistors that are discussed in the background section leave room for improvement in bipolar transistors in a number areas. For example, there is a need for 1) the extrinsic base implant to be self-aligned to the emitter opening; 2) the extrinsic base silicide to be self-aligned to the emitter opening; 3) the emitter polysilicon pattern to be self-aligned to the emitter opening; 4) the dopant profile to be formed in proximity of the emitter-base junction to optimize the base resistance and emitter-base leakage current; and 5) the extension base implant to be performed through only a thin oxide layer.

This disclosure describes a self-aligned transistor with an implanted extrinsic base that addresses the points mentioned above. More specifically, as shown in the embodiment in FIGS. 1-22, the invention forms a transistor in an integrated circuit structure that begins by forming a collector 12 in a substrate 10 and an intrinsic base 14 above the collector 12. Regions 18 are shallow trench isolation (STI) of the substrate 10 that separate the transistor from other structures. In this example, regions 16 comprise, for example, doped polysilicon 17 and various deposited oxides 18, 19. The methodologies and materials that can be used to form these structures are well known to those of ordinarily skilled in the art as explained in, for example, U.S. Pat. No. 6,534,372, mentioned above.

Figure 2:
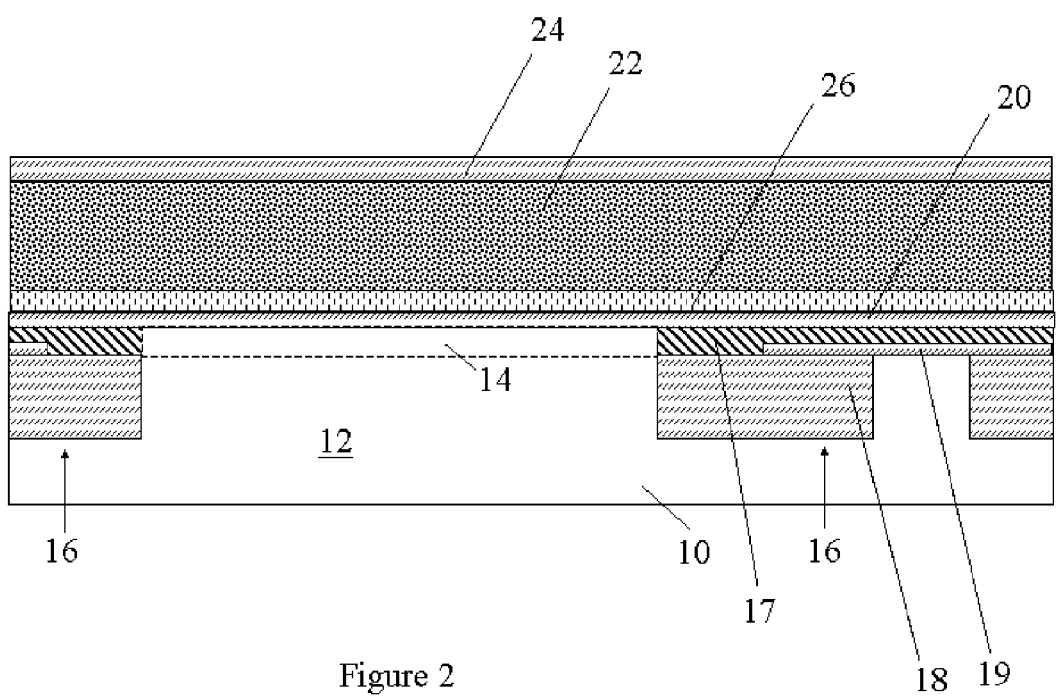
FIG. 2 is a schematic diagram of a partially completed bipolar transistor according to the invention.

As shown in FIG. 2, the invention forms a thin (10-20 nm) etch stop layer 20 (such as a deposited oxide), a nitride layer 26, and an alignment layer 22 which can comprise any suitable material, such as undoped polysilicon, etc. The thickness of the etch stop layer 20 is controlled to reduce the energy required for the process of forming the extrinsic base regions 82, 172, 192 that are discussed below. Another deposited oxide layer 24 is formed over the alignment layer 22 in the structure in FIG. 2.

Figure 3:
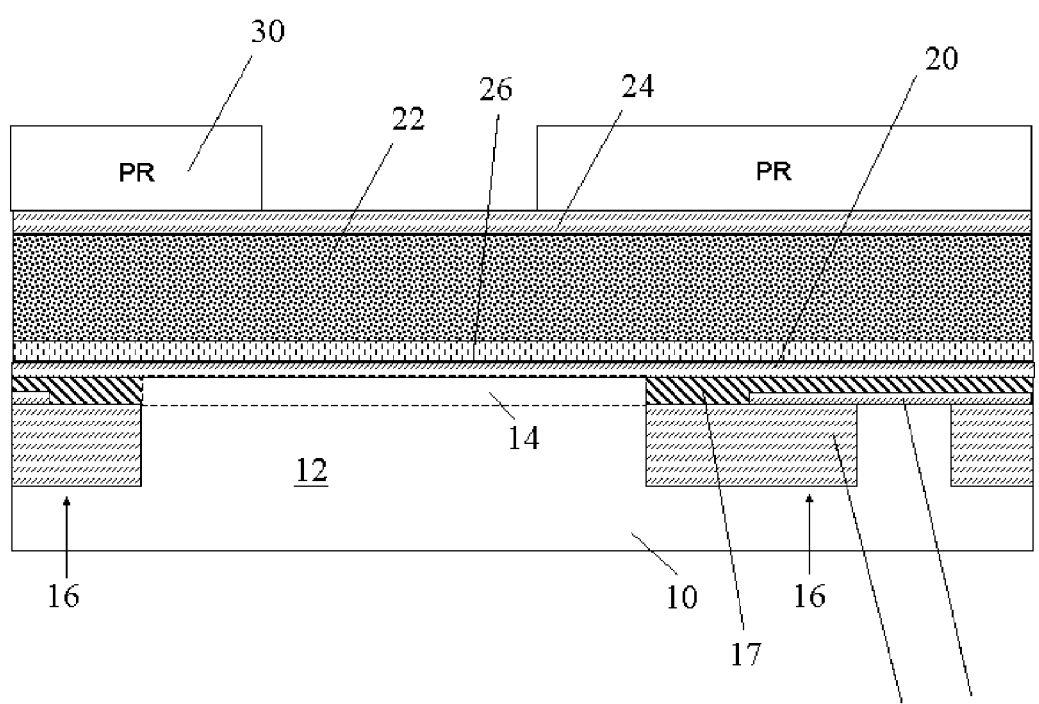
FIG. 3 is a schematic diagram of a partially completed bipolar transistor according to the invention.
Figure 4:
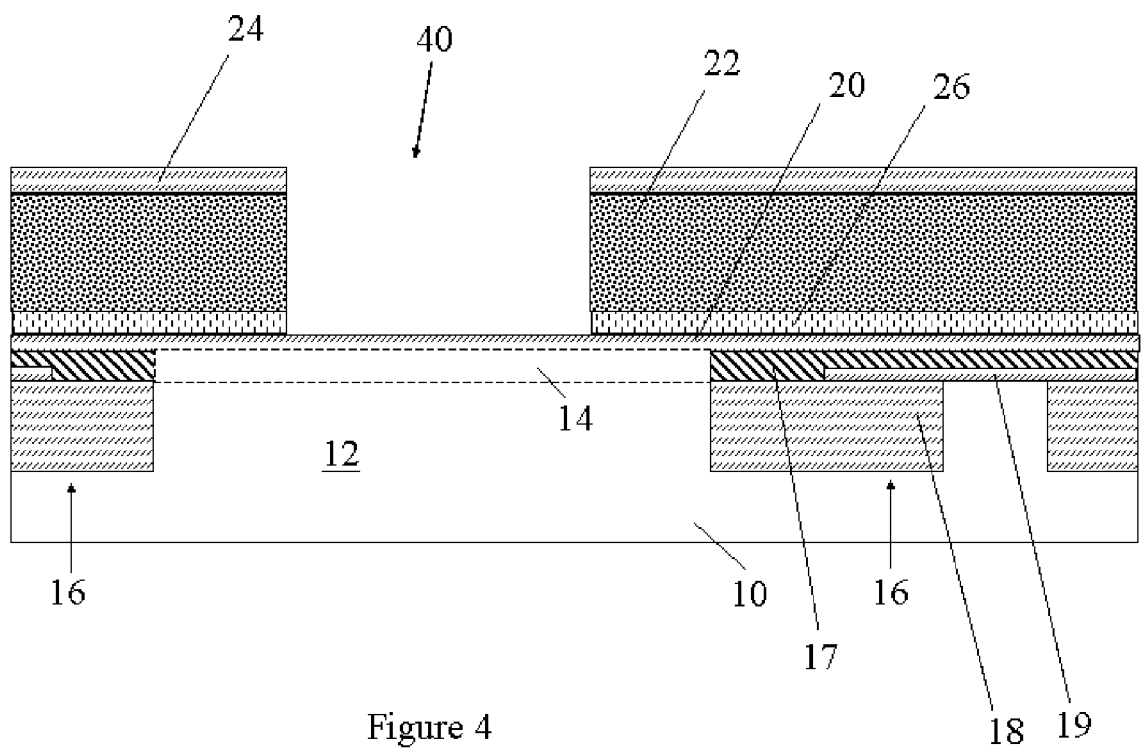
FIG. 4 is a schematic diagram of a partially completed bipolar transistor according to the invention.

Next, as shown in FIG. 3, a photoresist 30 is patterned over the oxide layer 24 and, as shown in FIG. 4, a material removal process (such as etching) is used to pattern the oxide layer 24, the alignment layer 22, and the nitride layer 26 stopping on the etch stop layer 20. This process forms an alignment opening 40.

Figure 5:
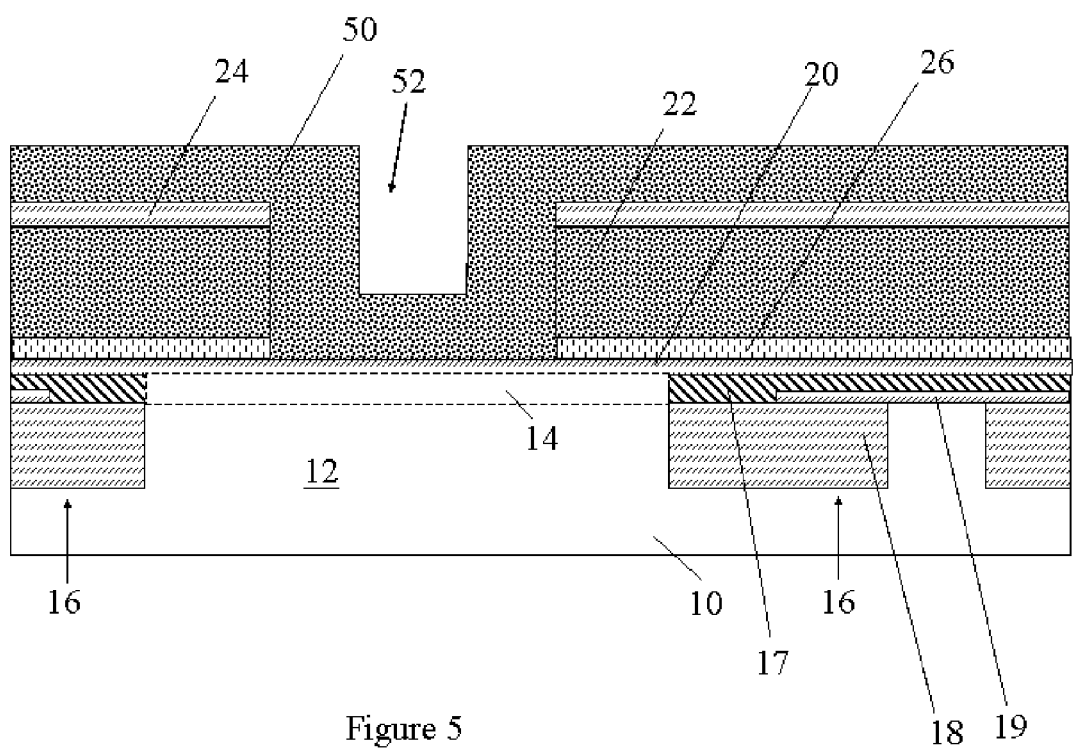
FIG. 5 is a schematic diagram of a partially completed bipolar transistor according to the invention.
Figure 6:
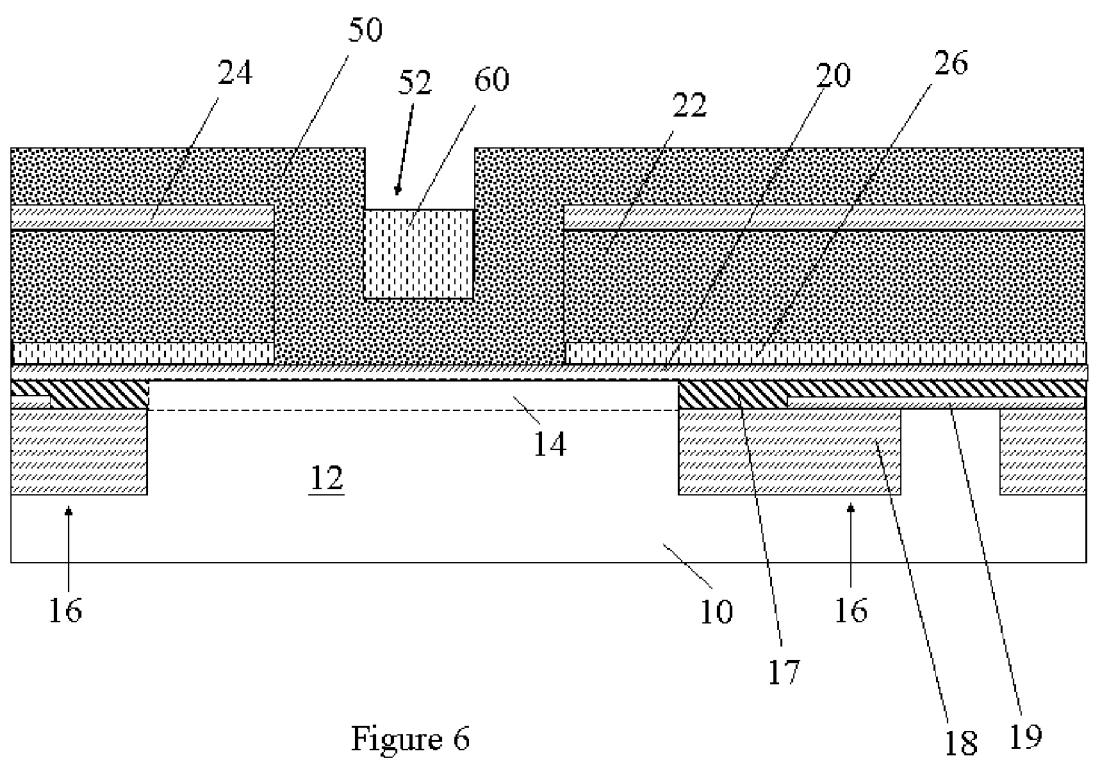
FIG. 6 is a schematic diagram of a partially completed bipolar transistor according to the invention.
Figure 7:
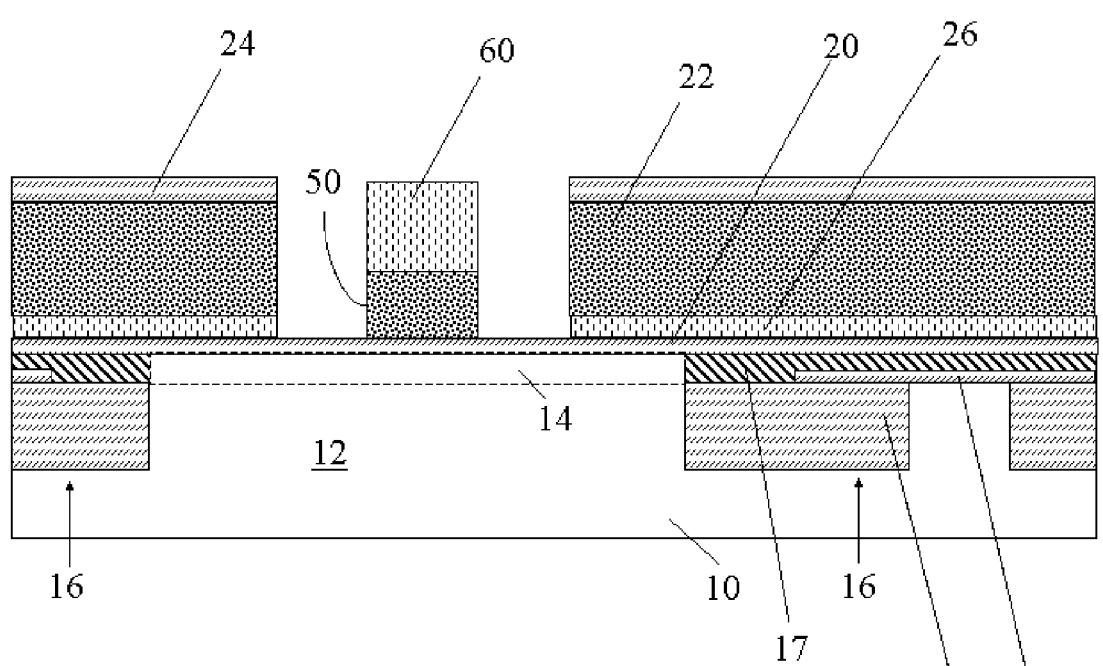
FIG. 7 is a schematic diagram of a partially completed bipolar transistor according to the invention.
Figure 8:
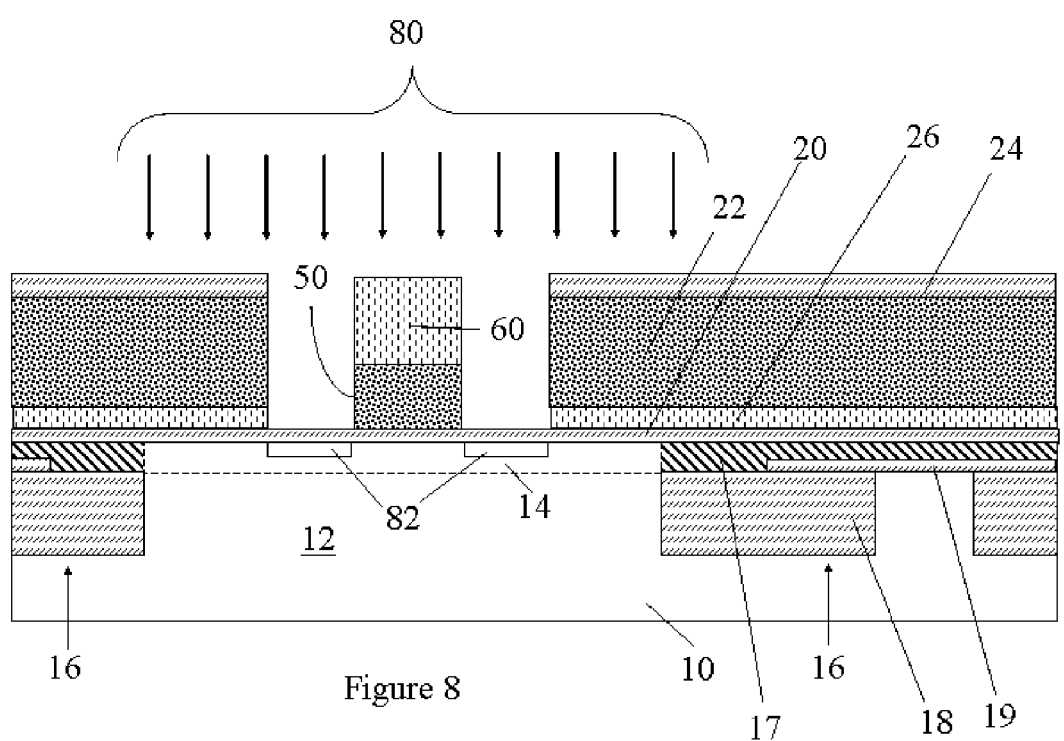
FIG. 8 is a schematic diagram of a partially completed bipolar transistor according to the invention.

In FIG. 5, a sacrificial material 50, such as undoped polysilicon, is conformally deposited over the oxide layer and within the alignment opening 40. This sacrificial material 50 will eventually become the emitter pedestal that is used to align the implants and the emitter. This conformal deposition process forms a second opening 52 in the first opening 40. Then, as shown in FIG. 6, a mask material 60 (such as nitride) is deposited into the second opening 52. As shown in FIG. 7, the mask material 60 is used to pattern the sacrificial material 50 into the emitter pedestal structure 50. Again, any conventional material removal process, such as etching, etc., can be used to pattern the sacrificial material 50. With the mask 60 in place above the sacrificial material 50, the first of a series of extrinsic base implant impurity doping processes is performed as indicated by arrows 80 in FIG. 8. This process forms the first section of the extrinsic base 82.

Figure 9:
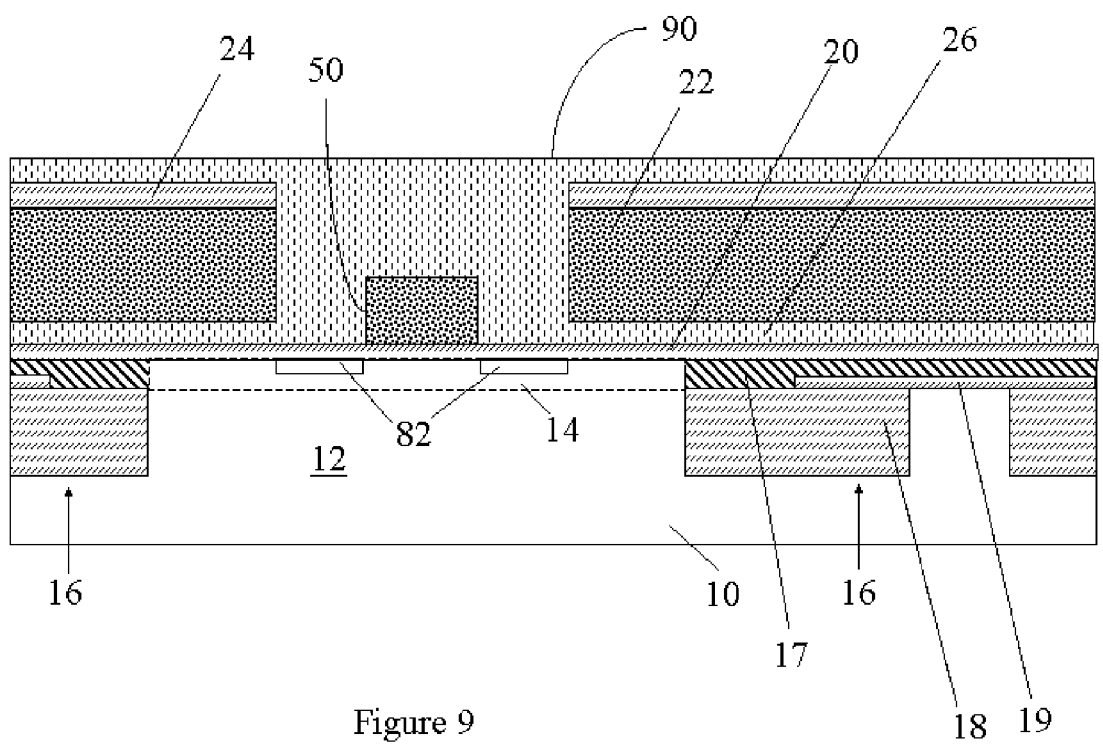
FIG. 9 is a schematic diagram of a partially completed bipolar transistor according to the invention.
Figure 10:
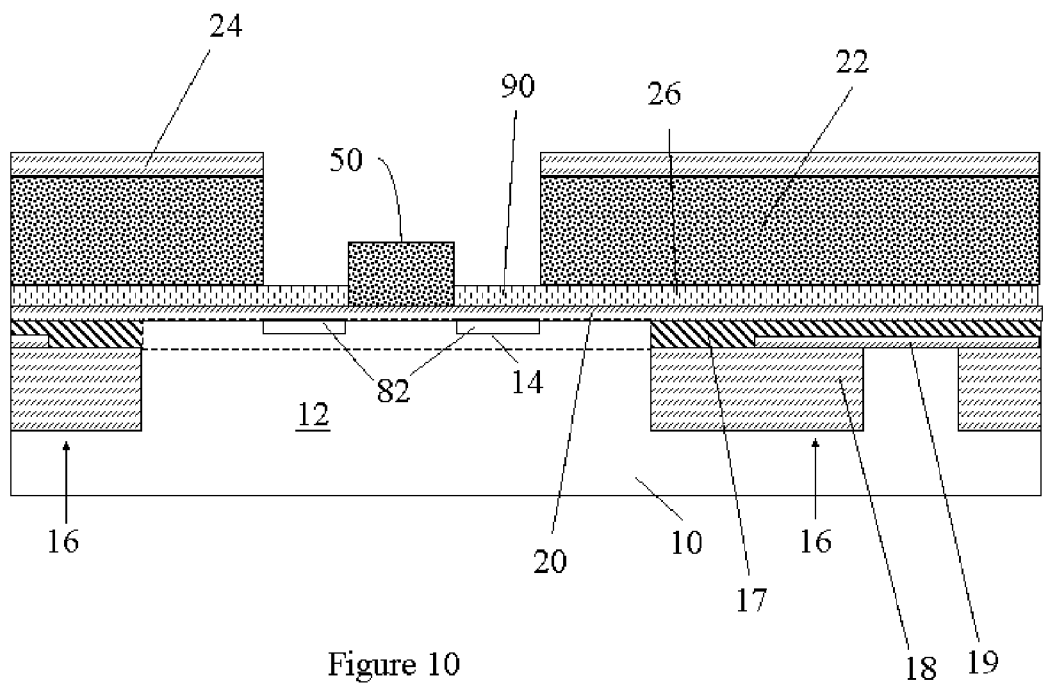
FIG. 10 is a schematic diagram of a partially completed bipolar transistor according to the invention.
Figure 11:
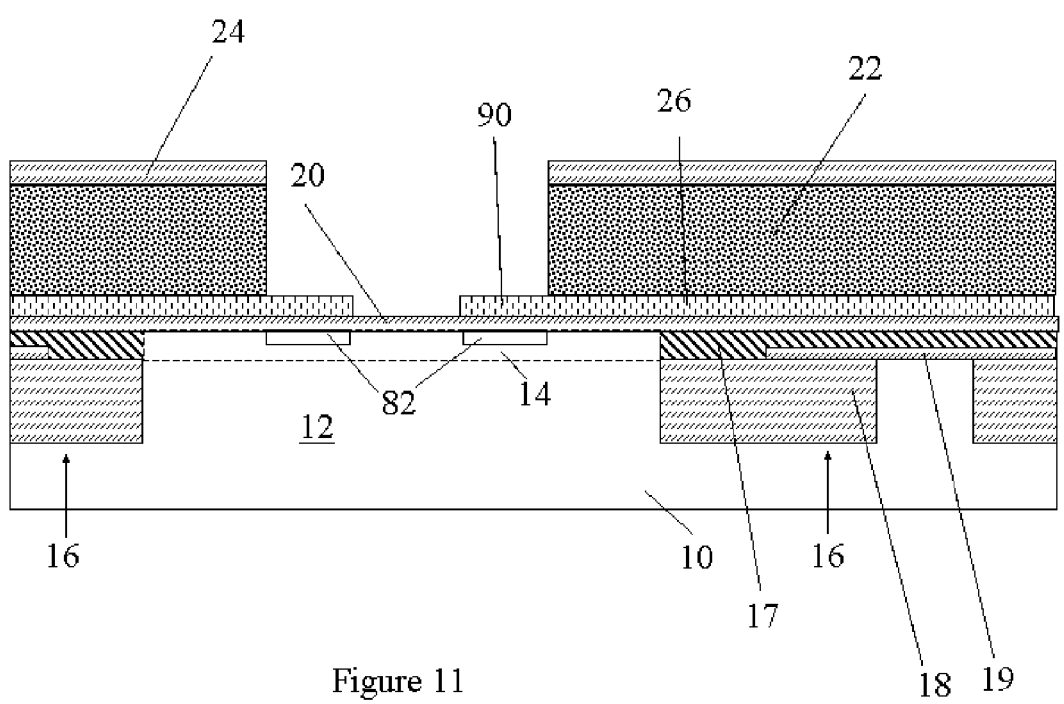
FIG. 11 is a schematic diagram of a partially completed bipolar transistor according to the invention.
Figure 12:
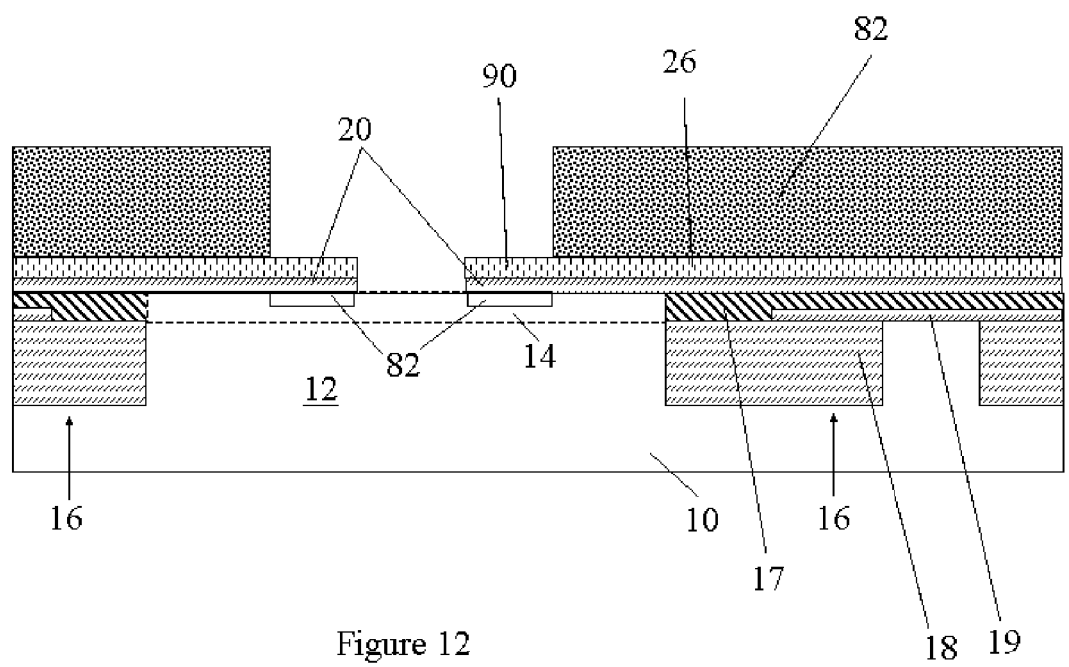
FIG. 12 is a schematic diagram of a partially completed bipolar transistor according to the invention.

In FIG. 9, additional nitride 90 is deposited and is selectively removed down to a level equal to nitride layer 26 (as shown in FIG. 10) using any selective material removal process that is designed to only attack the nitride 90 and leave the remaining structures substantially intact. The remaining thickness of nitride 90 will serve as an isolation dielectric between the emitter and the base. In FIG. 11, the emitter pedestal 50 is removed and in FIG. 12 both oxide 24 and oxide layer 20 are removed (again using selective removal processes).

Figure 13:
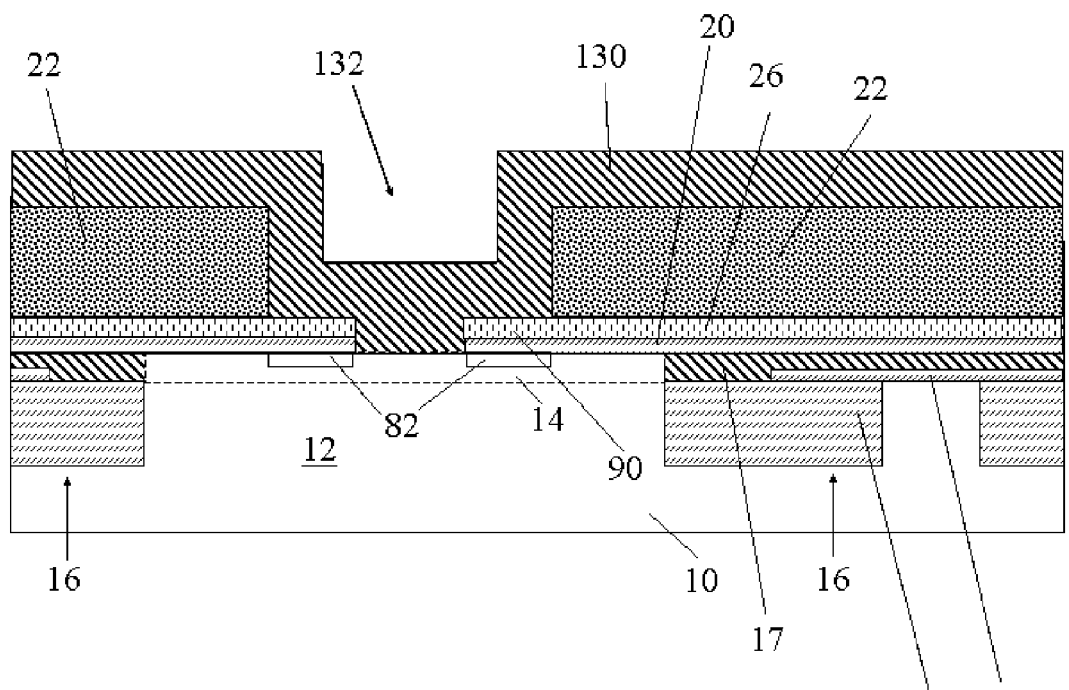
FIG. 13 is a schematic diagram of a partially completed bipolar transistor according to the invention.
Figure 14:
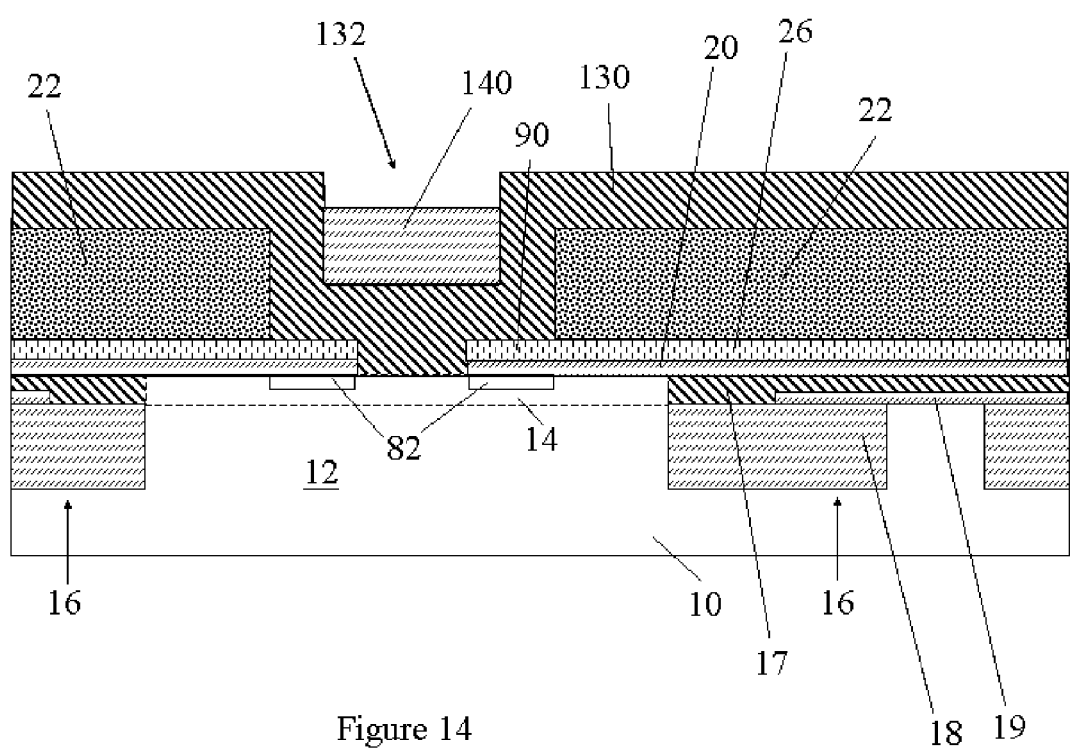
FIG. 14 is a schematic diagram of a partially completed bipolar transistor according to the invention.
Figure 15:
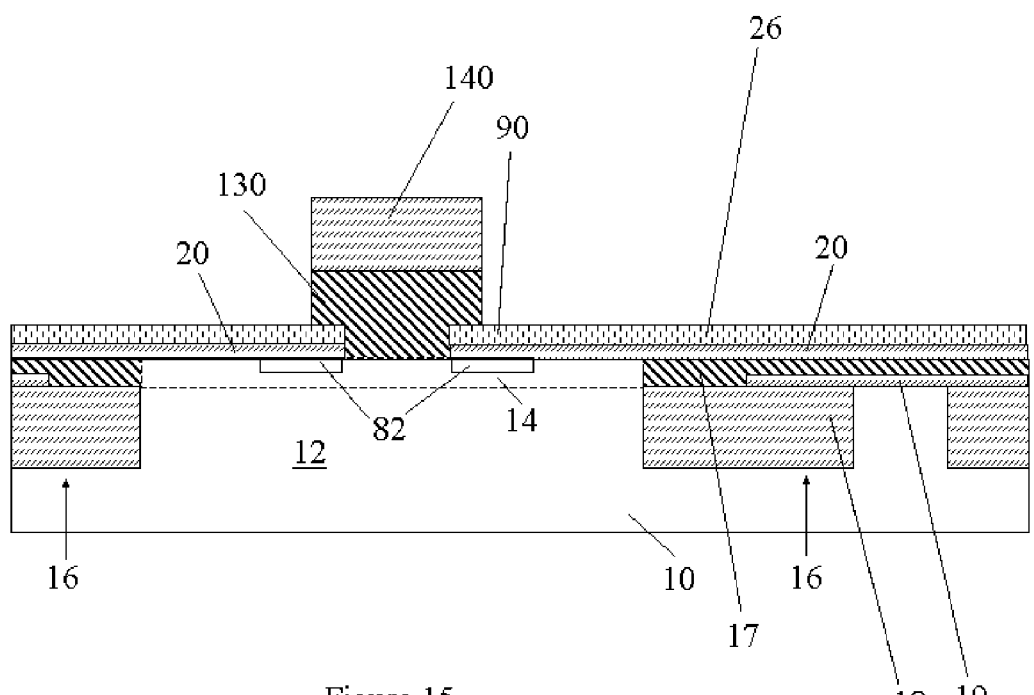
FIG. 15 is a schematic diagram of a partially completed bipolar transistor according to the invention.
Figure 16:
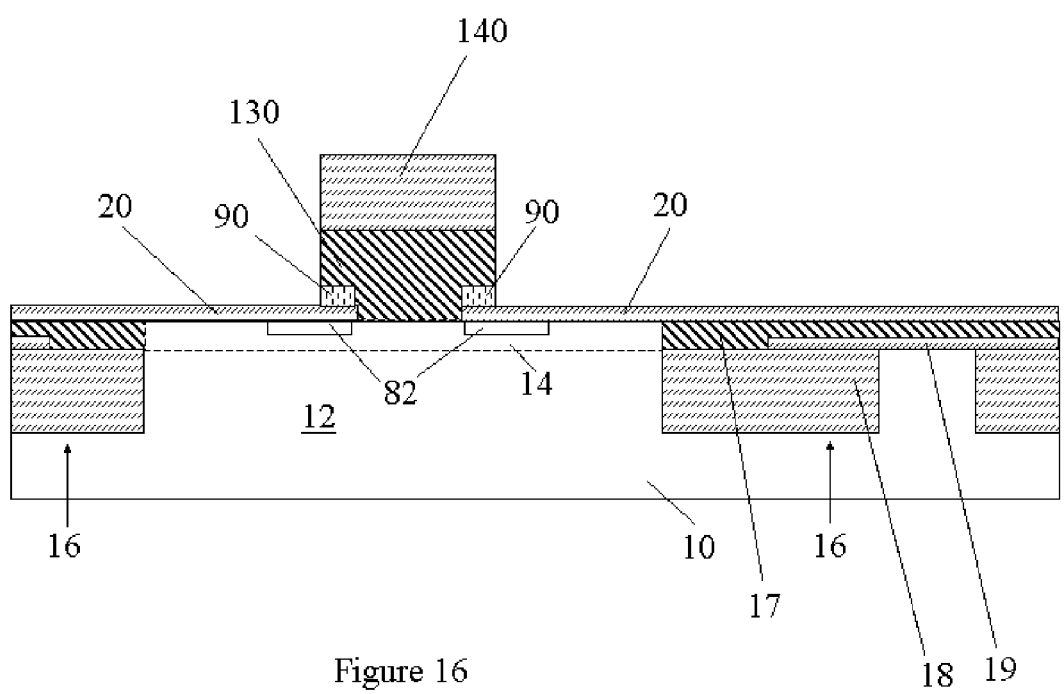
FIG. 16 is a schematic diagram of a partially completed bipolar transistor according to the invention.

Then, in FIG. 13, the emitter material 130 (such as doped polysilicon, or any other conductive material) is deposited in a conformal deposition process that produces a third opening 132 in a similar manner to second opening 52, as described above. In a similar manner to the previous processing, a mask material 140 such as a deposited oxide or other masking material is formed within the third opening 132 (as shown in FIG. 14) and then the exposed portions of the emitter material 130 and the undoped polysilicon 22 are removed using material 140 as a mask, which results in the structure shown FIG. 15. In FIG. 16, this material removal process is continued (or a different material removal process can be commenced) to remove the exposed portions of the nitride layer 26, 90. Again, any conventional material removal process, such as etching, can be utilized in these steps.

Figure 17:
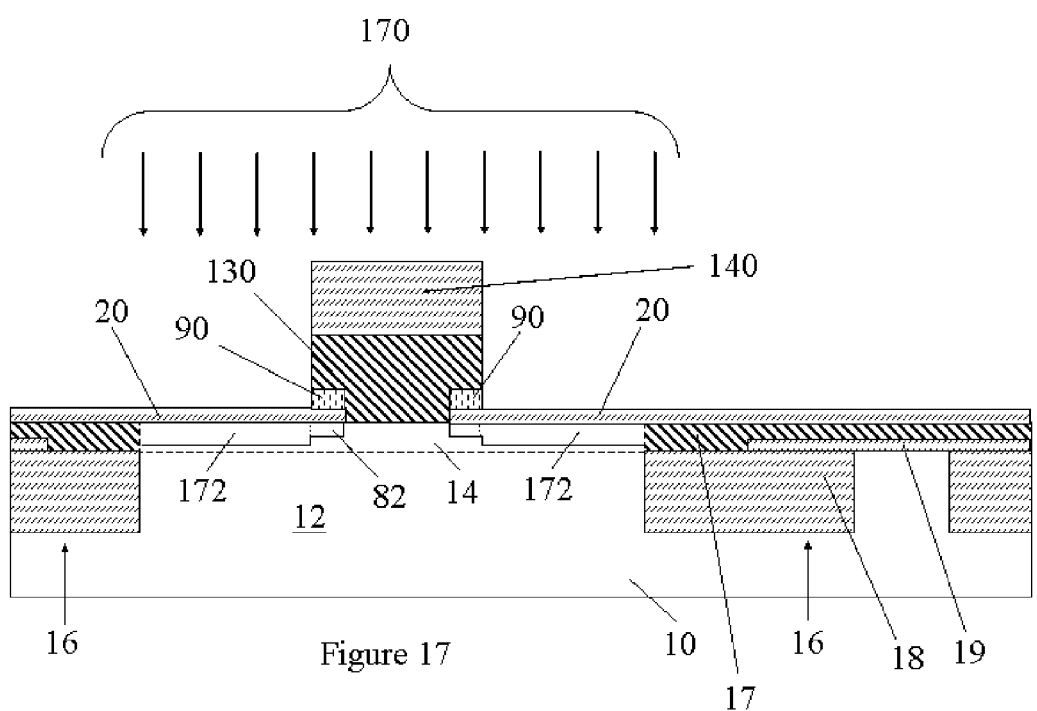
FIG. 17 is a schematic diagram of a partially completed bipolar transistor according to the invention.
Figure 18:
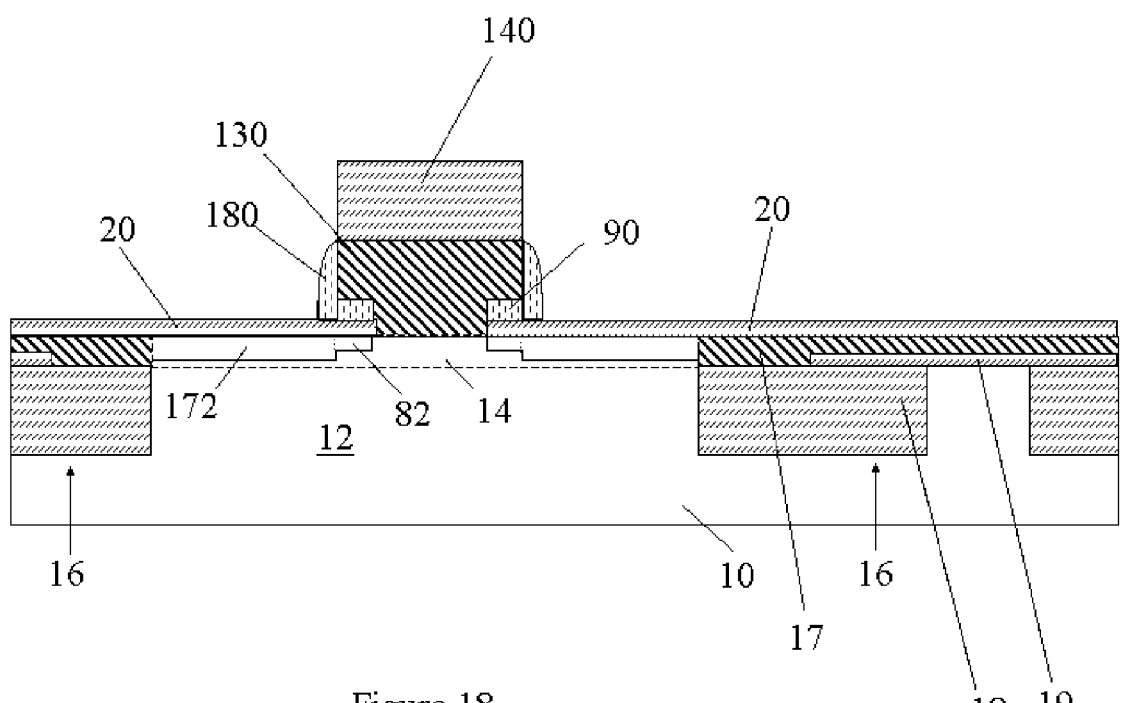
FIG. 18 is a schematic diagram of a partially completed bipolar transistor according to the invention.
Figure 19:
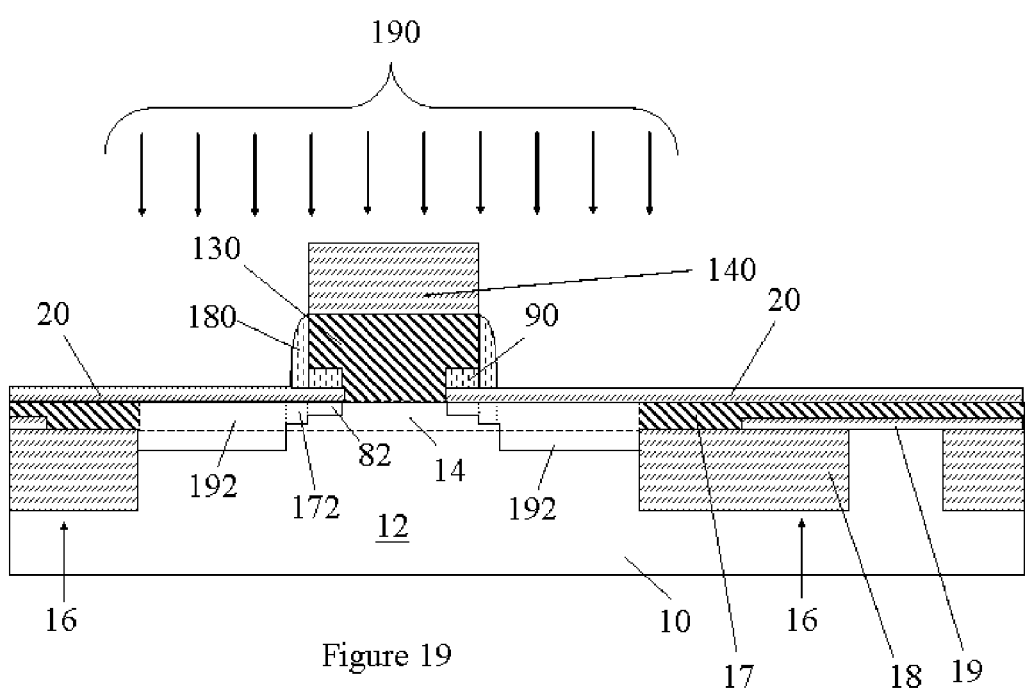
FIG. 19 is a schematic diagram of a partially completed bipolar transistor according to the invention.

In FIG. 17, a second impurity 170 is implanted into the exposed portions of the substrate 10 to form the second portion of the extrinsic base 172. After this, spacer 180 is formed along the sidewalls of the emitter 130. The spacer 180 can comprise, for example, a nitride (or other similar material) that is deposited and then removed in a directional removal process (such as anisotropic etching) that removes the nitride from horizontal surfaces at a faster rate than it removes the nitride material from vertical surfaces, thereby leaving the sidewall spacer 180 along the sidewalls of the emitter 130 as shown in FIG. 18. Next, as shown in FIG. 19, a third impurity implant 190 is performed to form the third portion of the extrinsic base implant 192.

Figure 20:
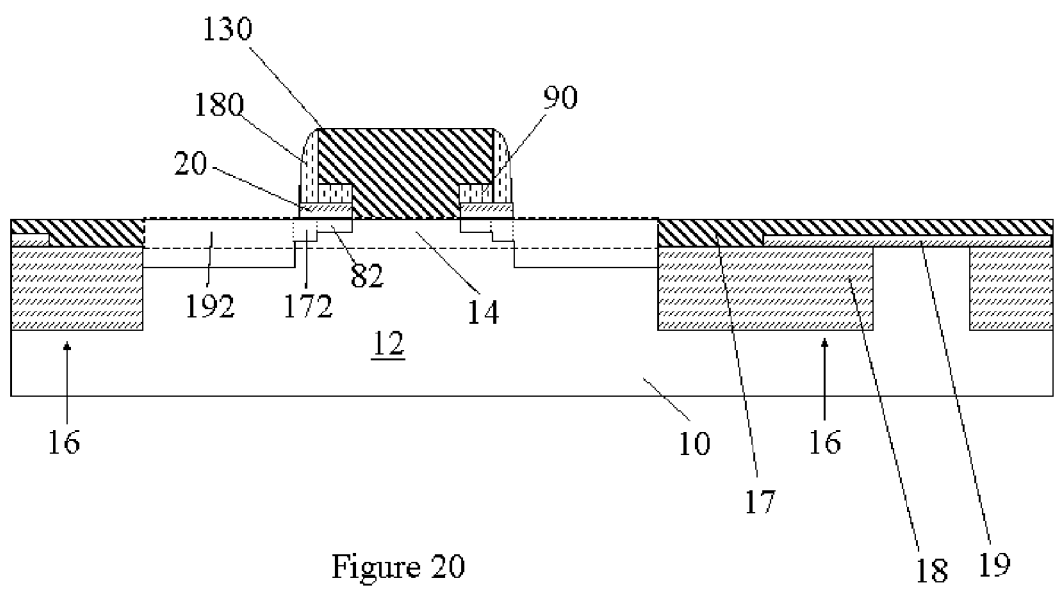
FIG. 20 is a schematic diagram of a partially completed bipolar transistor according to the invention.
Figure 21:
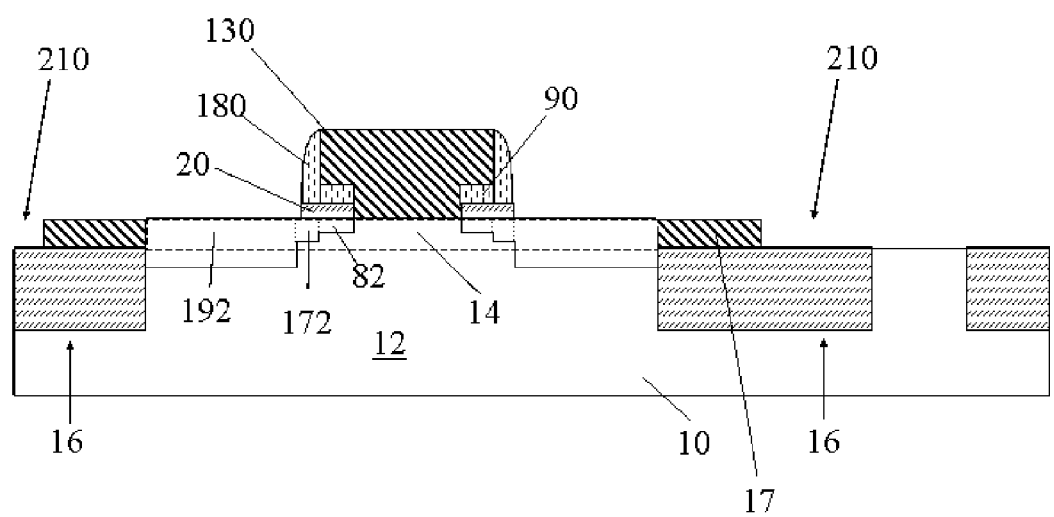
FIG. 21 is a schematic diagram of a partially completed bipolar transistor according to the invention.
Figure 22:
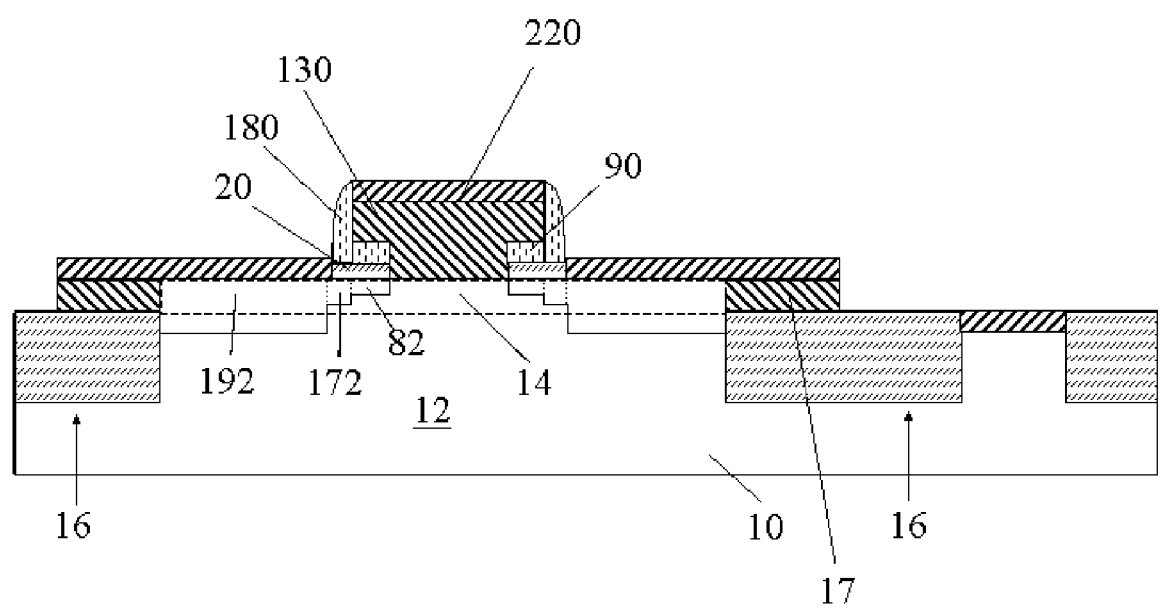
FIG. 22 is a schematic diagram of a partially completed bipolar transistor according to the invention.

In FIG. 20, the etch stop layer 20 and the mask 140 are removed, again using any selective material removal process, such as etching. In FIG. 21 the boundary of the conductor 17 is defined using conventional patterning processes (such as masking and etching). In FIG. 22, a silicide region 220 is formed over the conductors 17 and the extrinsic base region 192 using well-known siliciding processes that involve applying heat in the presence of a metal, as is well known to those ordinarily skilled in this art field. Thus, the silicide regions 220 are formed without having to use alignment masks, etc., and therefore, self-aligned silicide regions or salicides 220. In other words, the silicide 220 of the extrinsic base 192 and the top of the emitter 130 is self-aligned to the extent to base 82, 172, 192 and the emitter 130. Thus, with the use of the spacers 180 and the alignment features (such as the nitride 90, the emitter pedestal 50, etc.), the silicide 220, the extrinsic base 82, 172, 192, and the emitter 130 are all self-aligned with each other and do not require the more expensive and less accurate mask-type alignment processes.

The resulting structure shown in FIG. 22 has a collector 12 and intrinsic base 14 in the substrate 10, extrinsic base regions 82, 172, 192 in the substrate 10 adjacent the intrinsic base 14, an emitter 130 above the intrinsic base 14 and self-aligned silicide regions 220. The emitter 130 has a T-shape where the upper portion is wider than the lower portion. Further, the extrinsic base 82, 172, 192 includes multiple steps, when viewed in cross-section. These steps comprise lengths of the extrinsic base 82, 172, 192 that extend different depths into the substrate 10, wherein each successive length of the extrinsic base 82, 172, 192 away from intrinsic base 14 extends further into the substrate 10 from the top of the substrate 10.

The embodiment shown in FIGS. 23-41 produces a similar structure as the embodiment shown in FIGS. 1-22, using different processing techniques. The same or similar items that are discussed above with respect to the embodiment shown in FIGS. 1-22 are identified with the same identification character or number and a redundant discussion of such elements is avoided for brevity.

Figure 23:
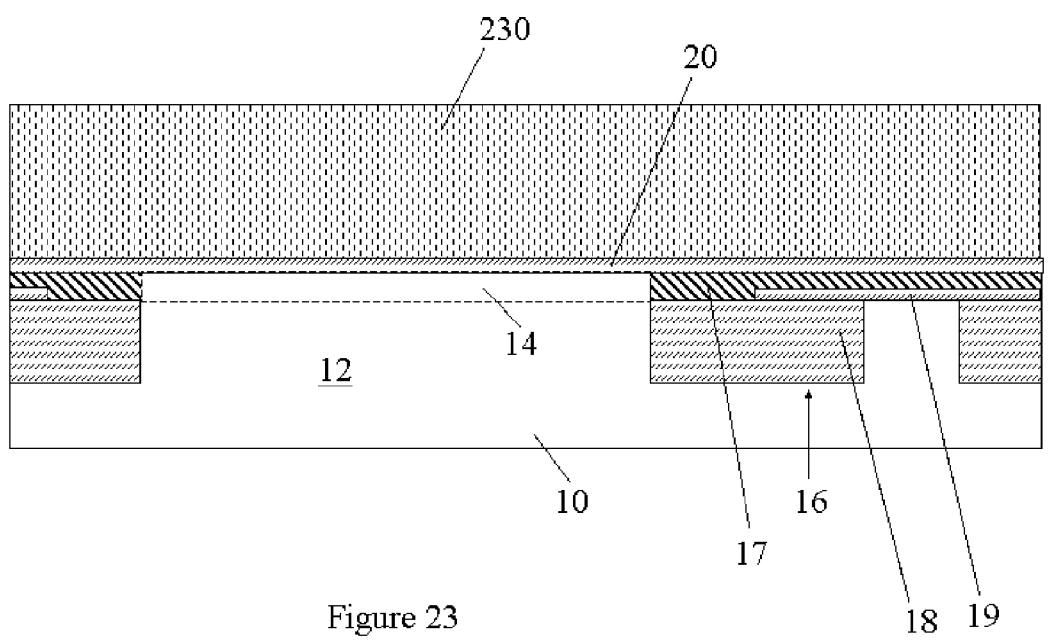
FIG. 23 is a schematic diagram of a partially completed bipolar transistor according to the invention.
Figure 24:
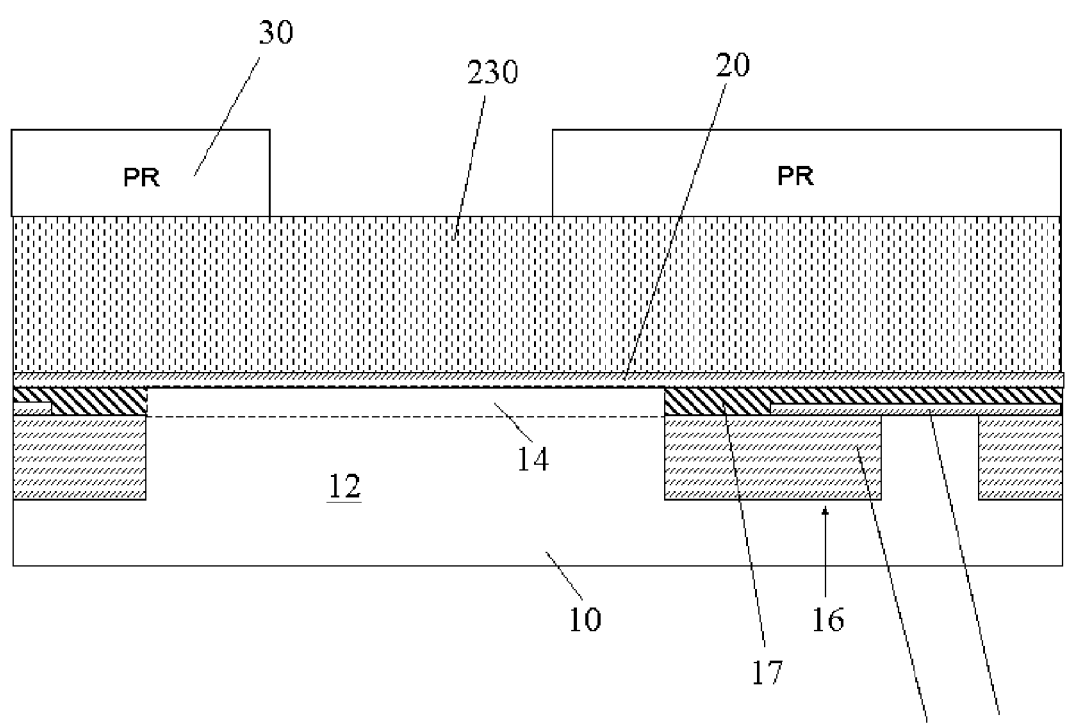
FIG. 24 is a schematic diagram of a partially completed bipolar transistor according to the invention.
Figure 25:
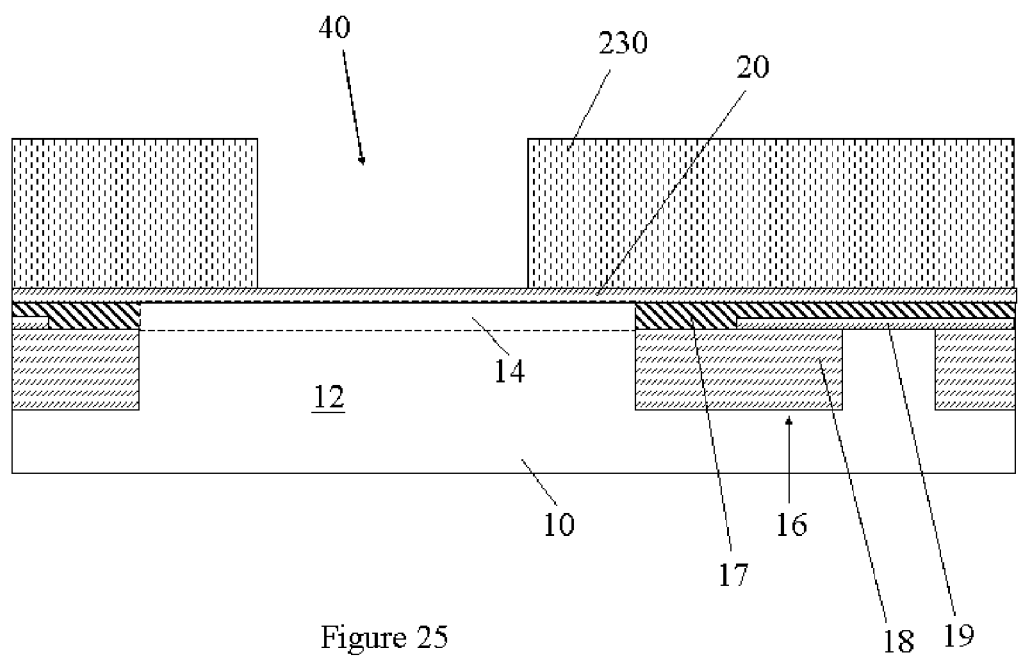
FIG. 25 is a schematic diagram of a partially completed bipolar transistor according to the invention.
Figure 26:
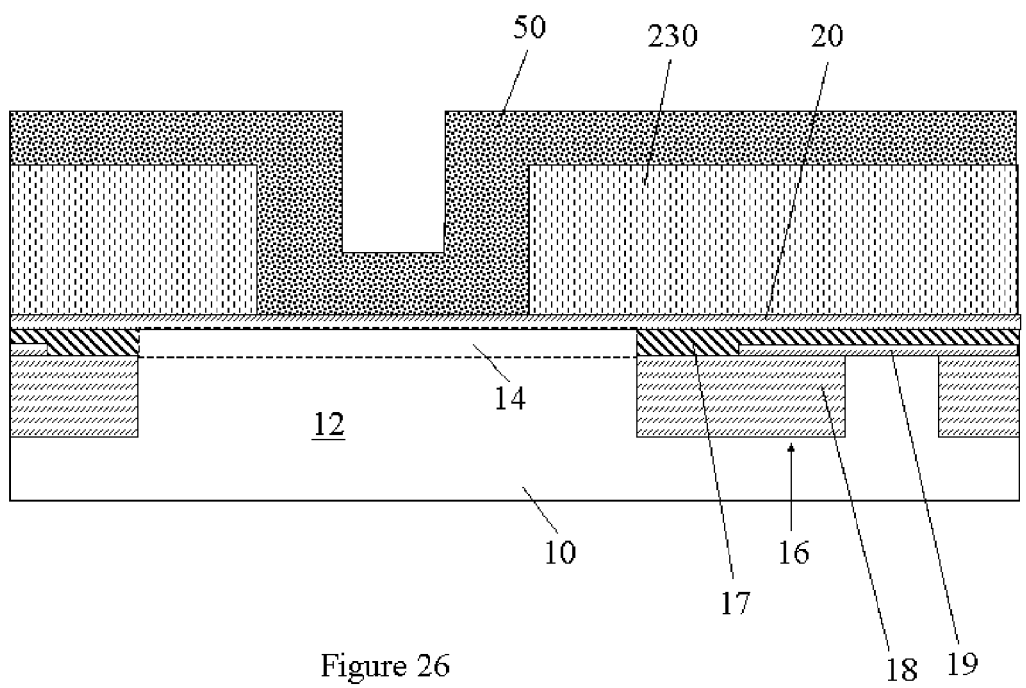
FIG. 26 is a schematic diagram of a partially completed bipolar transistor according to the invention.
Figure 27:
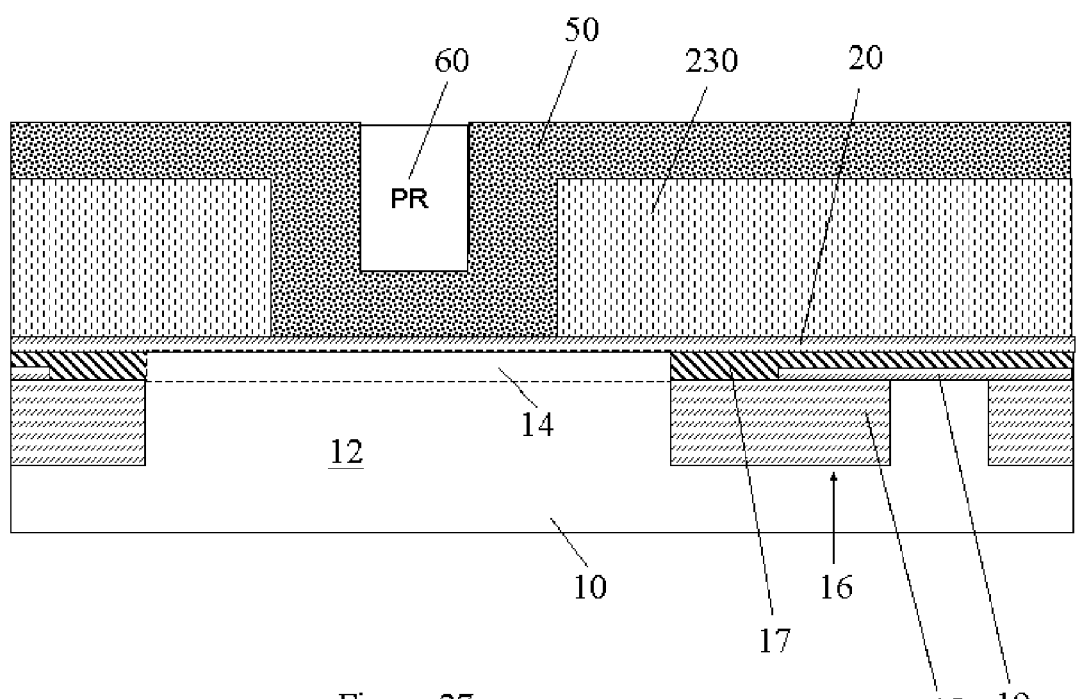
FIG. 27 is a schematic diagram of a partially completed bipolar transistor according to the invention.
Figure 28:
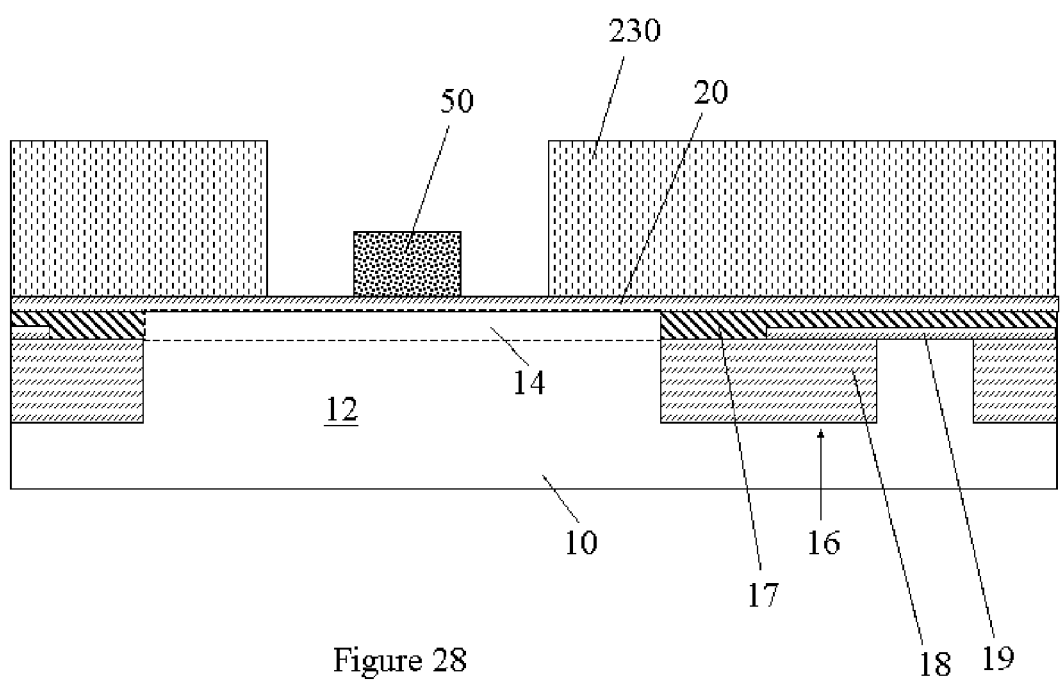
FIG. 28 is a schematic diagram of a partially completed bipolar transistor according to the invention.
Figure 29:
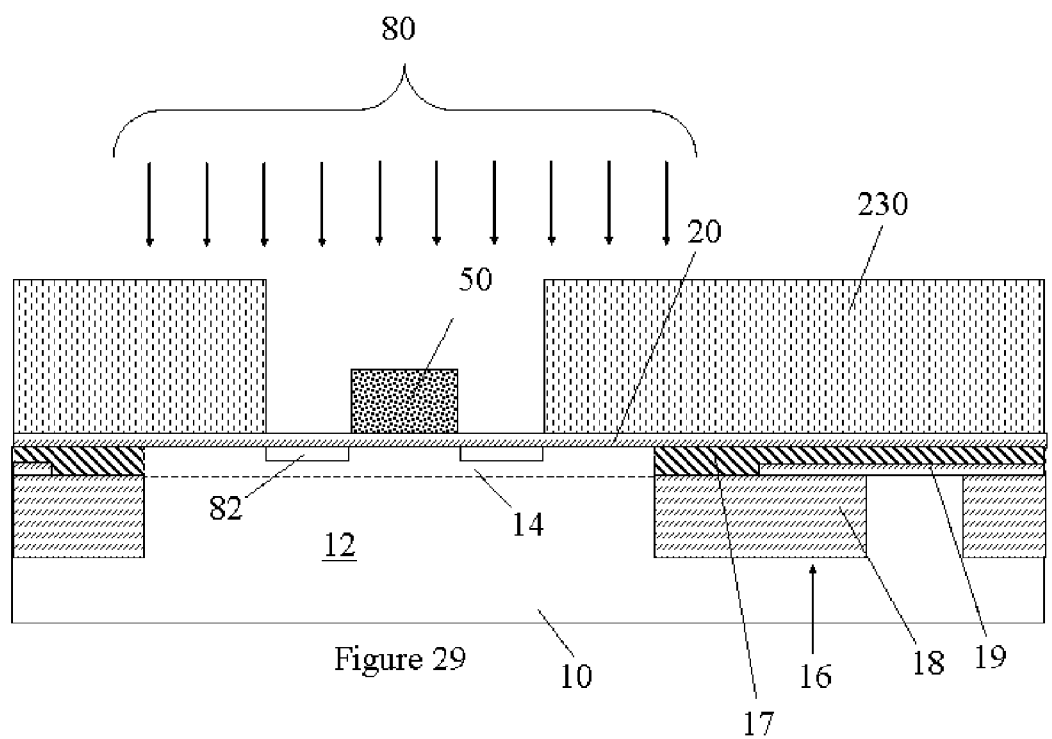
FIG. 29 is a schematic diagram of a partially completed bipolar transistor according to the invention.
Figure 30:
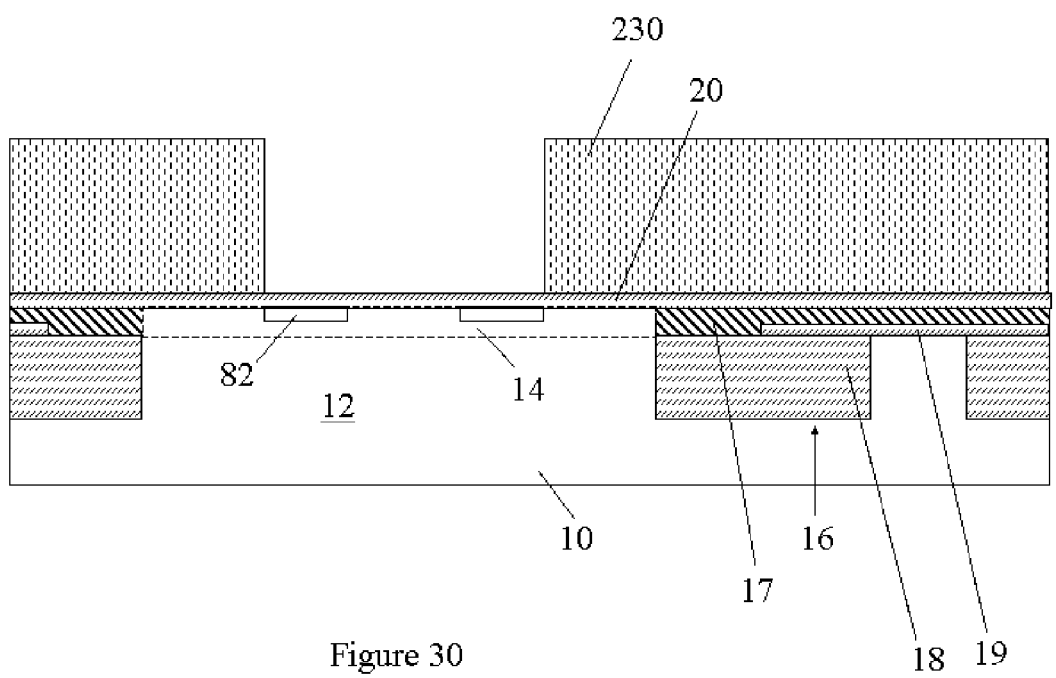
FIG. 30 is a schematic diagram of a partially completed bipolar transistor according to the invention.

The structure shown FIG. 23 is similar to the structure shown in FIG. 2 except that layers 22, 24, and 26 are replaced with layer 230 which can comprise, for example, nitride. In FIG. 24, a mask 30 is formed in a similar manner as shown below in FIG. 3, and in FIG. 25, the same opening 40 discussed below in FIG. 4 is formed. Again in FIG. 26, the sacrificial material 50 is formed and the same is patterned in FIGS. 27-28 as discussed below with respect to FIGS. 6 and 7. Note that in FIG. 28, the mask material 60 is removed while in FIG. 7 the mask material 60 is allowed to remain. The same impurity implant 80 is made in FIG. 29 as was made in FIG. 8. Then, in FIG. 30, the sacrificial material 50 is removed.

Figure 31:
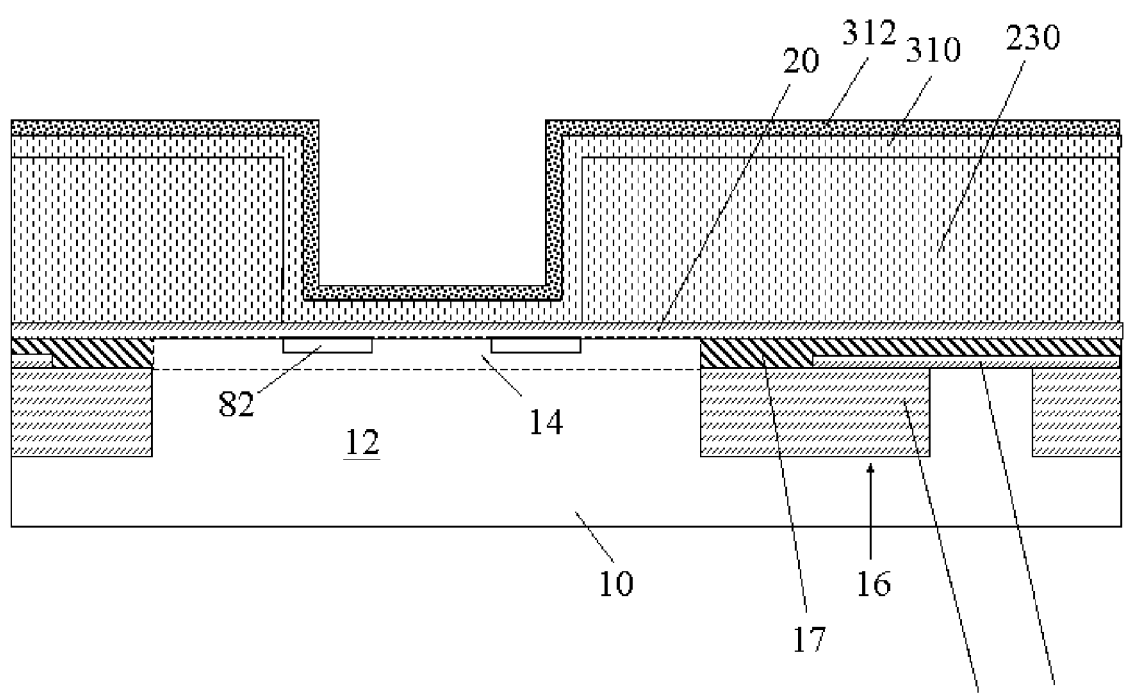
FIG. 31 is a schematic diagram of a partially completed bipolar transistor according to the invention.
Figure 32:
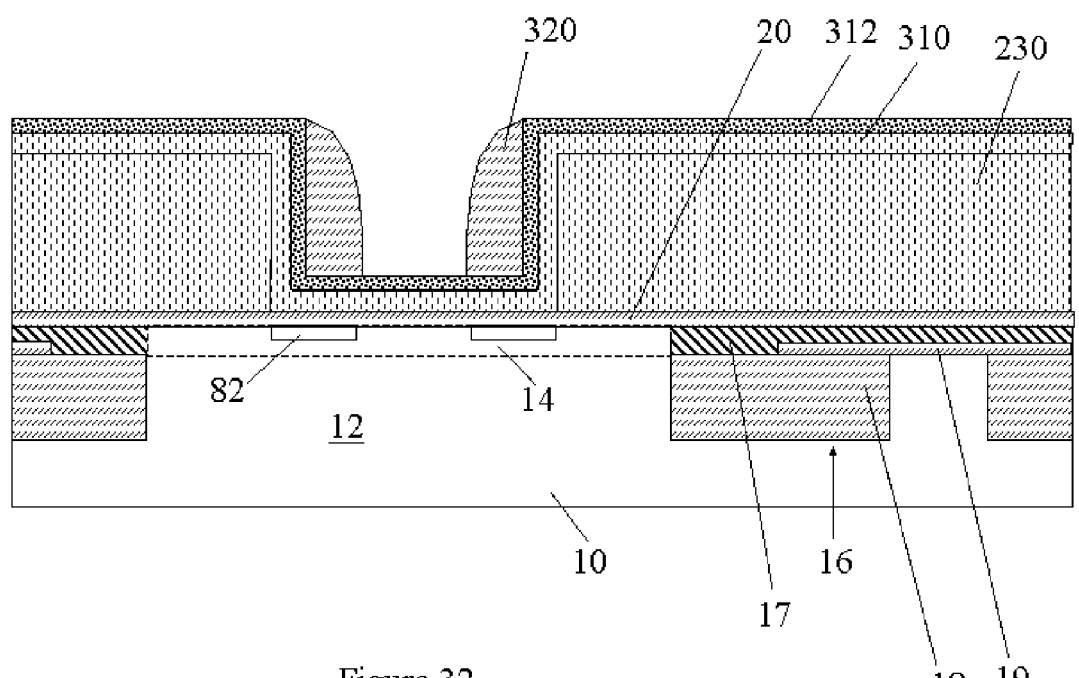
FIG. 32 is a schematic diagram of a partially completed bipolar transistor according to the invention.
Figure 33:
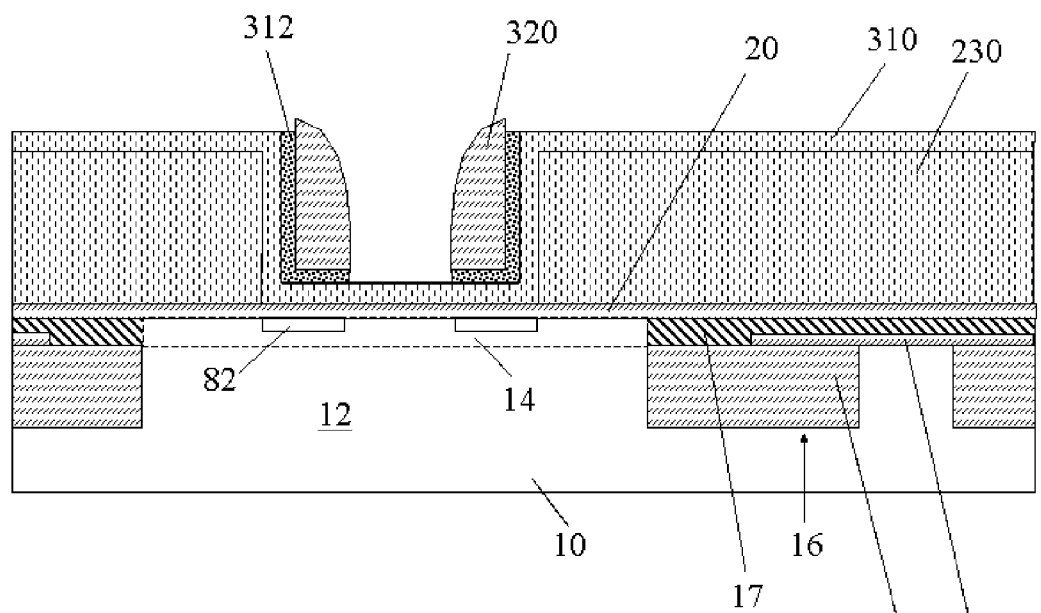
FIG. 33 is a schematic diagram of a partially completed bipolar transistor according to the invention.
Figure 34:
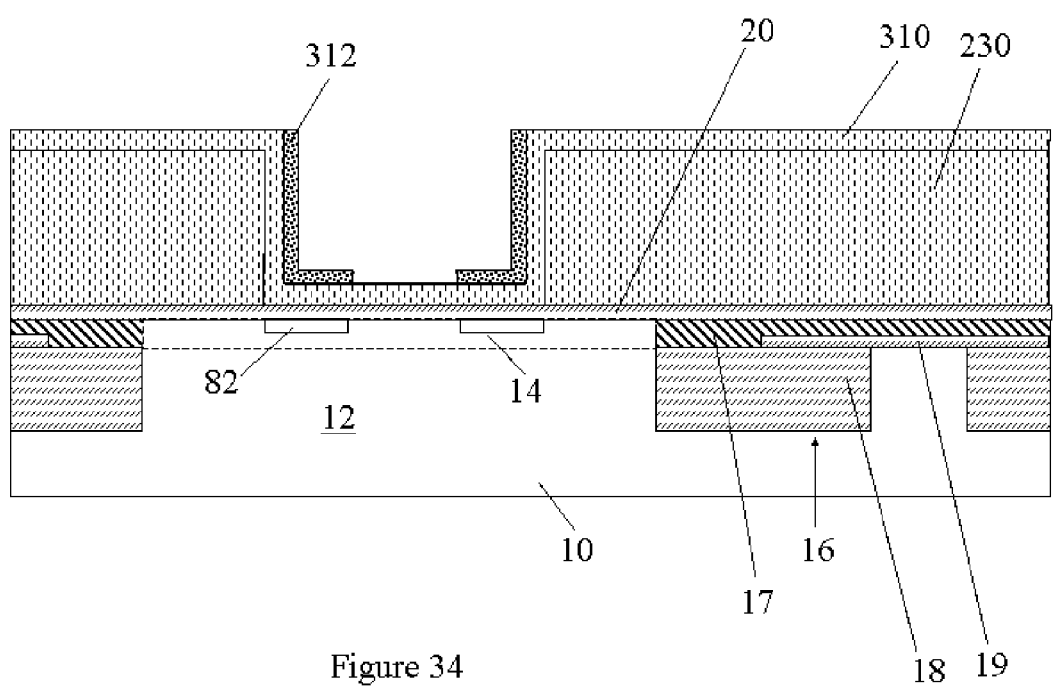
FIG. 34 is a schematic diagram of a partially completed bipolar transistor according to the invention.
Figure 35:
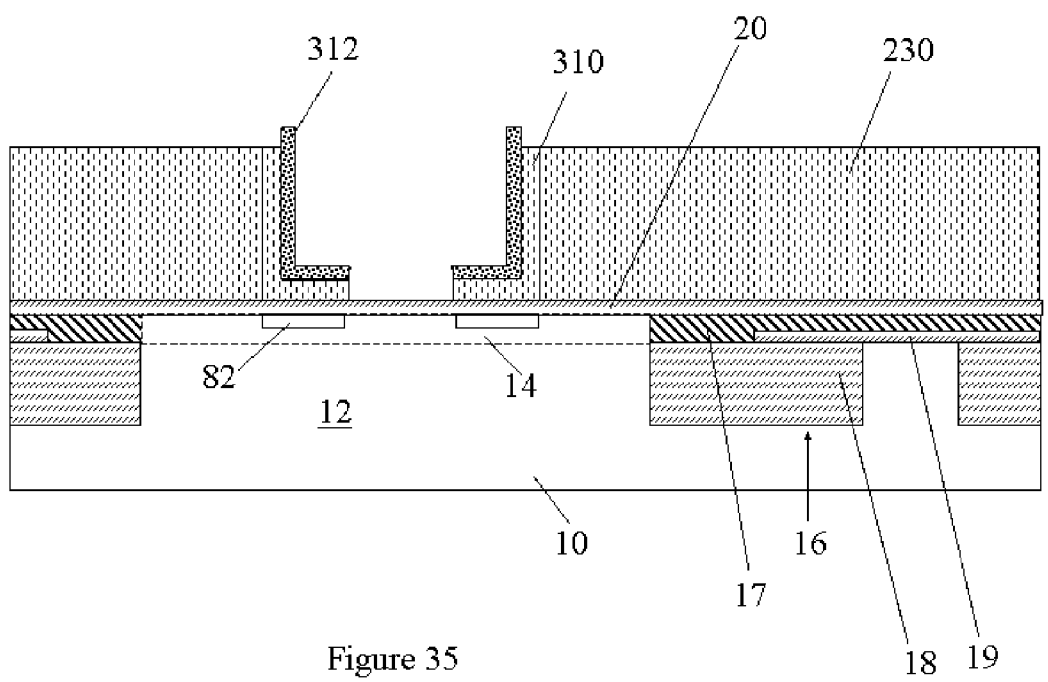
FIG. 35 is a schematic diagram of a partially completed bipolar transistor according to the invention.
Figure 36:
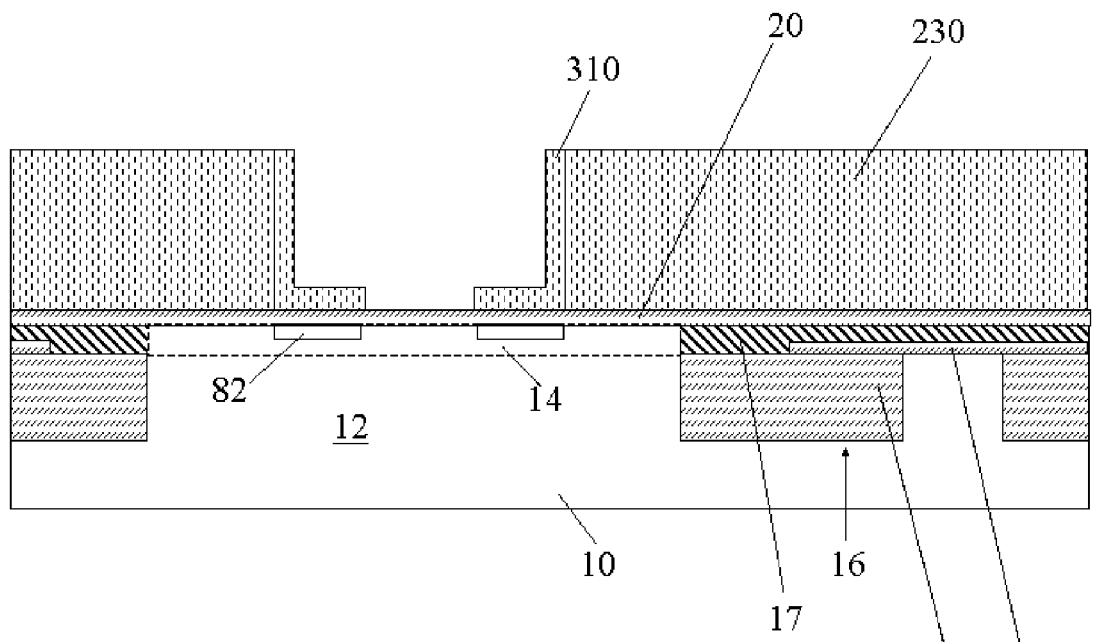
FIG. 36 is a schematic diagram of a partially completed bipolar transistor according to the invention.
Figure 37:
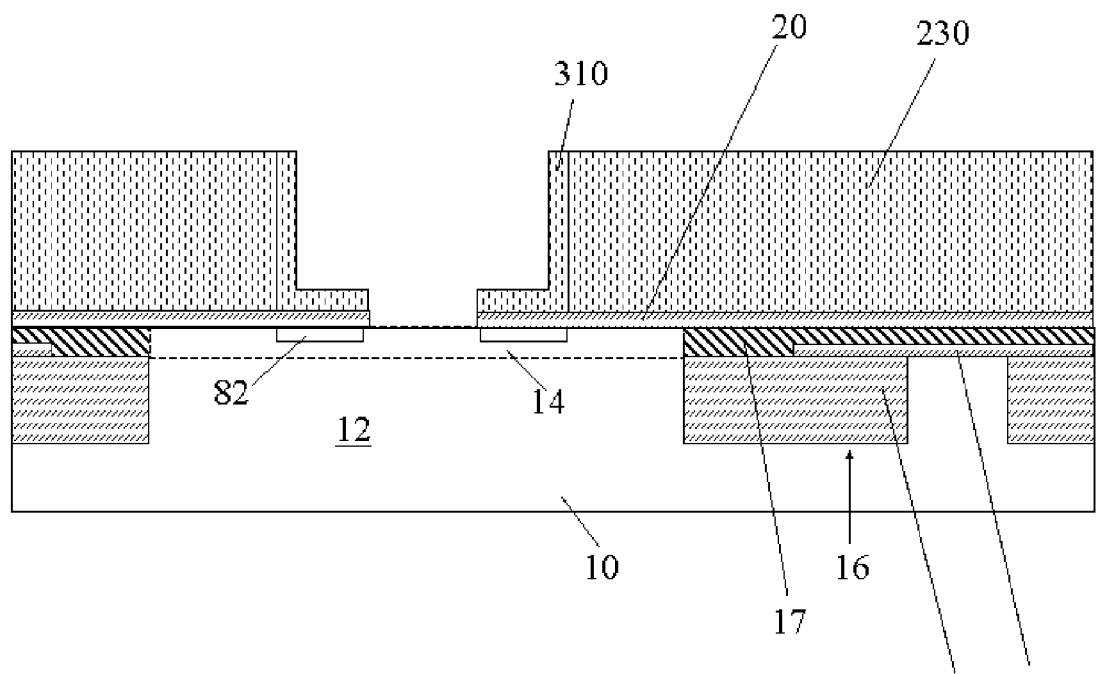
FIG. 37 is a schematic diagram of a partially completed bipolar transistor according to the invention.

In FIG. 31, conformal nitride (310) and undoped polysilicon (312) layers are deposited over the structure. In FIG. 32, sidewall spacer 320 (such as deposited oxide) is formed in a similar sidewall spacer formation process that formed the previous sidewall spacer 180. In FIG. 33, a selective removal process removes the undoped polysilicon layer 312. This removal process does not affect the regions of the undoped polysilicon 312 that are protected by the spacers 320. In FIG. 34, the spacers 320 are removed and in FIG. 35 the exposed portion of the nitride layer 310 is removed. Following this, the remaining undoped polysilicon 312 is removed, as shown in FIG. 36, and the central exposed portion of the etch stop layer 20 is removed, again using a selective material removal processes, as shown FIG. 37

Figure 38:
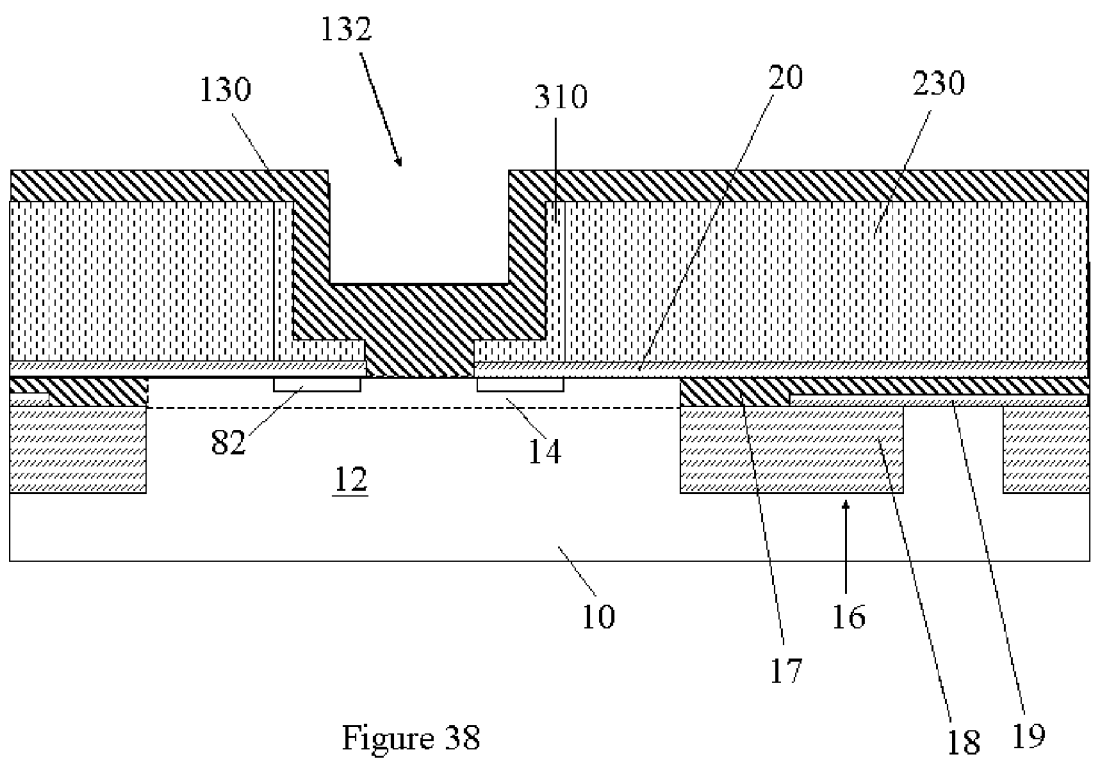
FIG. 38 is a schematic diagram of a partially completed bipolar transistor according to the invention.
Figure 39:
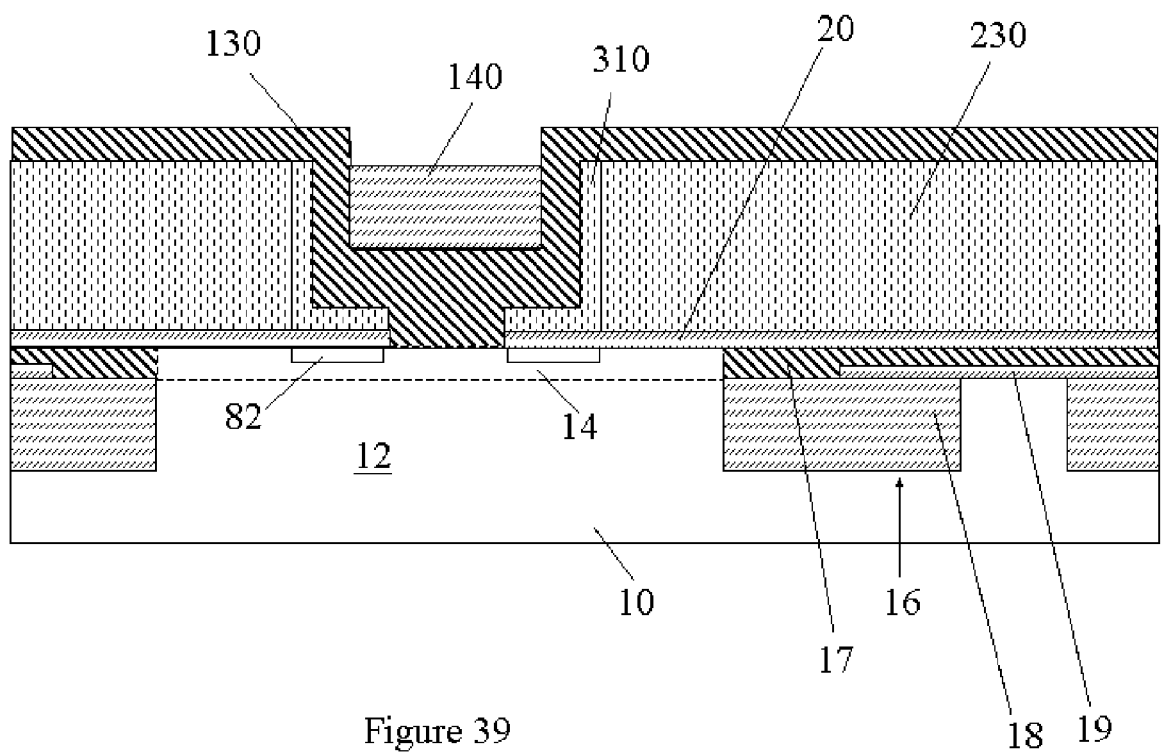
FIG. 39 is a schematic diagram of a partially completed bipolar transistor according to the invention.
Figure 40:
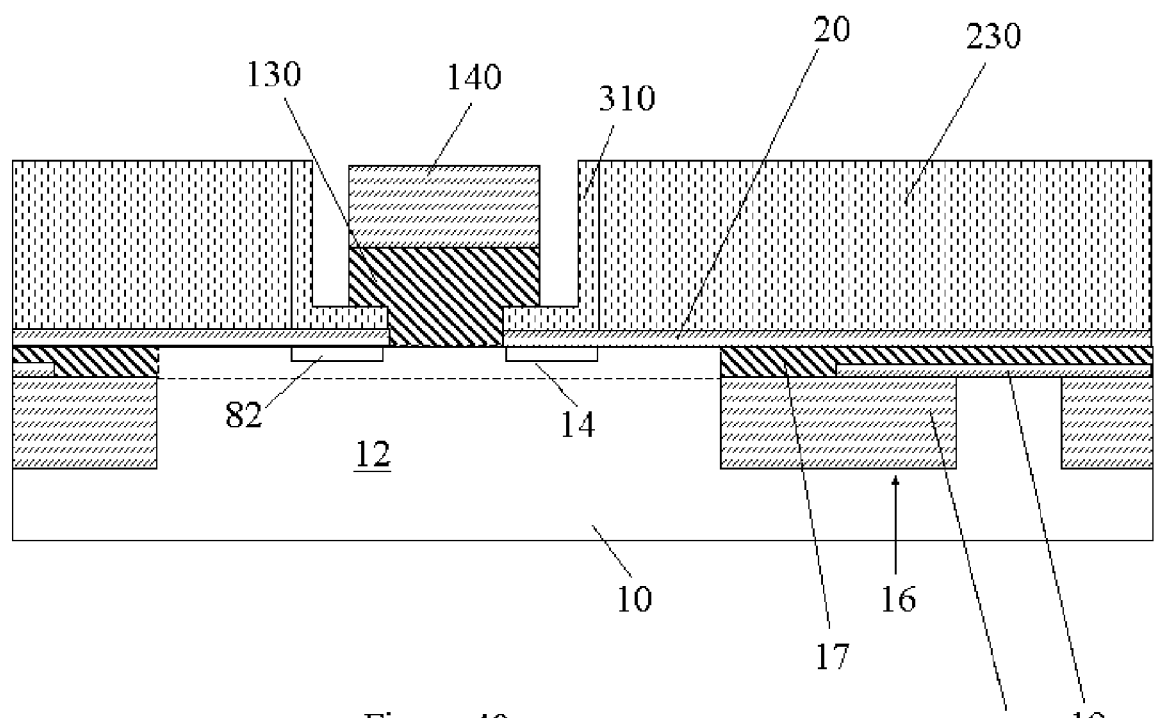
FIG. 40 is a schematic diagram of a partially completed bipolar transistor according to the invention.
Figure 41:
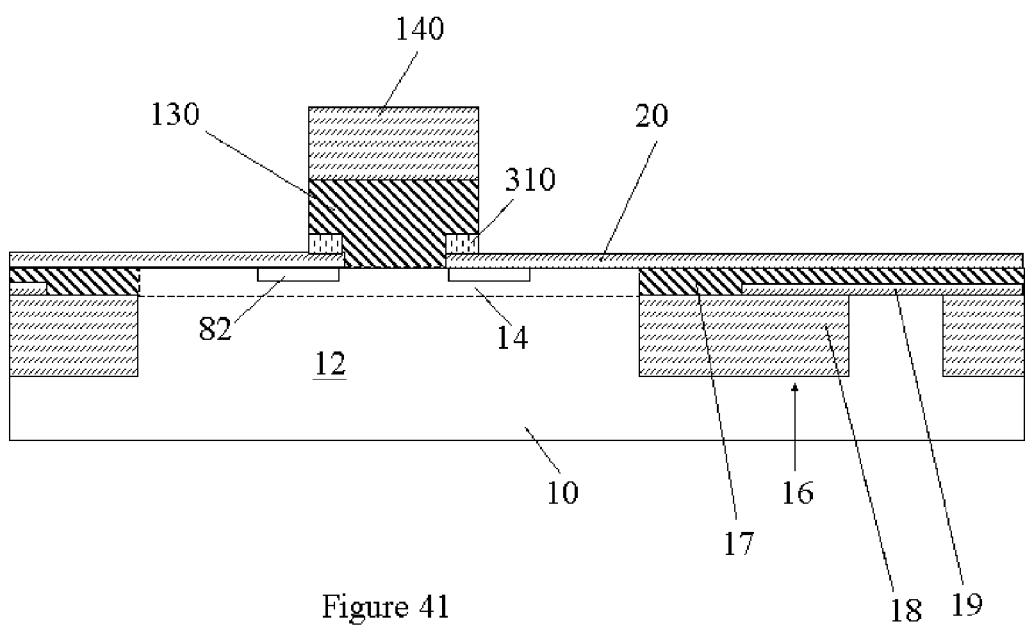
FIG. 41 is a schematic diagram of a partially completed bipolar transistor according to the invention.

In FIG. 38, the emitter material 130 is deposited as was done in FIG. 13, above. In a similar manner to that shown FIG. 14 above, in FIG. 39, the mask 140 is formed in the recess 132 of the emitter material. Next, the exposed portions of the emitter material 130 are removed, again in a selective material removal process, as shown in FIG. 40. The nitride regions 310 and 230 are removed (again in a selective material removal process) resulting in the structure shown in FIG. 41. The structure shown in FIG. 41 is substantially similar to the structure shown in FIG. 16 and processing steps similar to the those shown in FIGS. 17-22 are performed on the structure to complete this embodiment of the invention.

Figure 42:
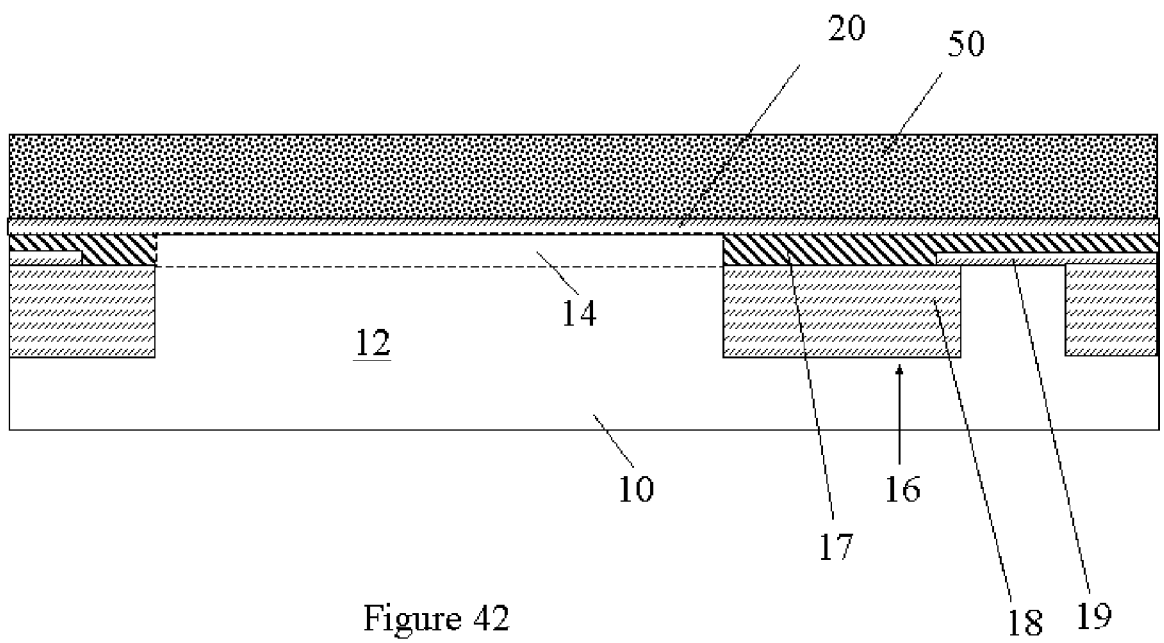
FIG. 42 is a schematic diagram of a partially completed bipolar transistor according to the invention.
Figure 43:
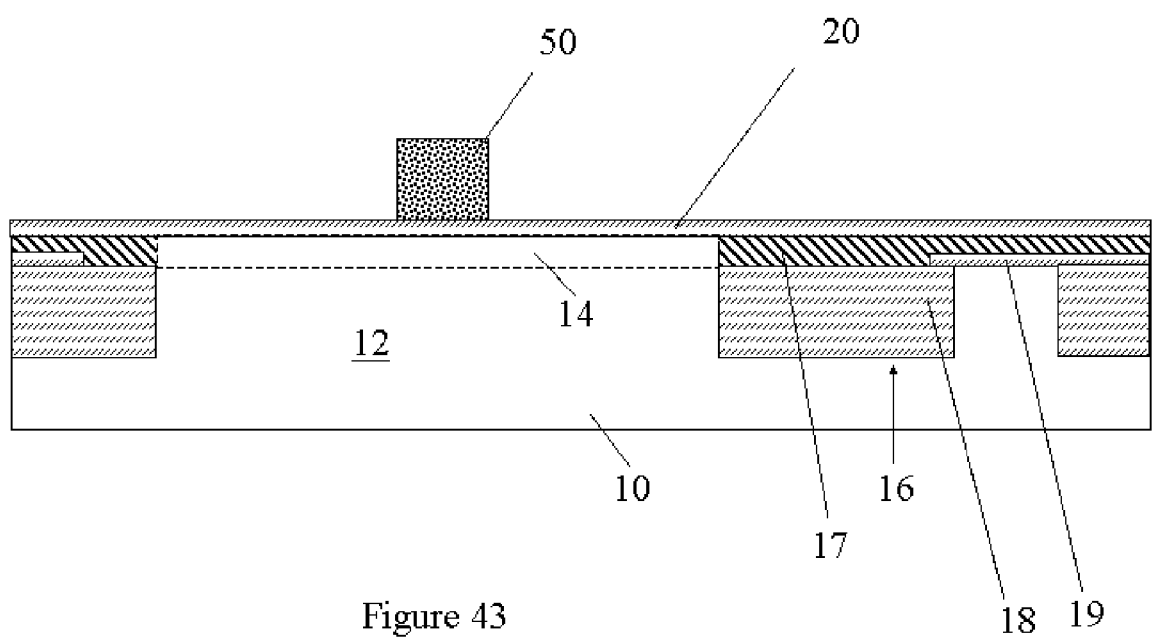
FIG. 43 is a schematic diagram of a partially completed bipolar transistor according to the invention.

The second embodiment is shown in FIGS. 42-57. More specifically, as shown in FIG. 42, this process begins with a structure that is somewhat similar to that shown in FIG. 2 and includes the etch stop layer 20 and the sacrificial material 50 above the etch stop layer 20. The sacrificial layer 50 is patterned using standard photolithographic techniques to form an emitter pedestal 50 for the lower portion of the emitter on the substrate 10 above the intrinsic base 14, as shown in FIG. 43.

Figure 44:
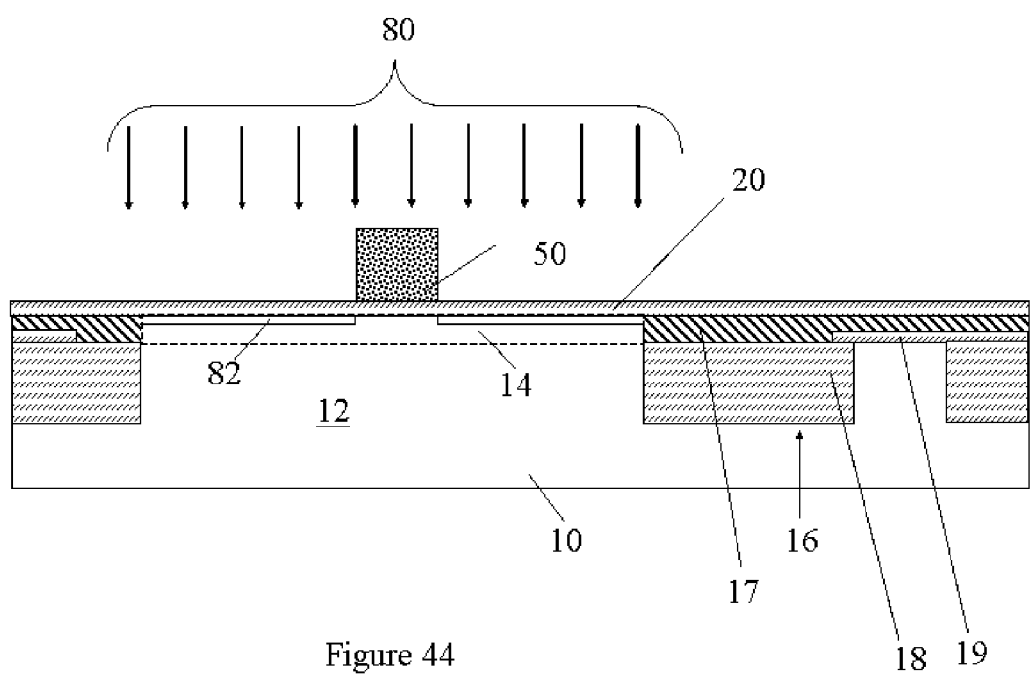
FIG. 44 is a schematic diagram of a partially completed bipolar transistor according to the invention.
Figure 45:
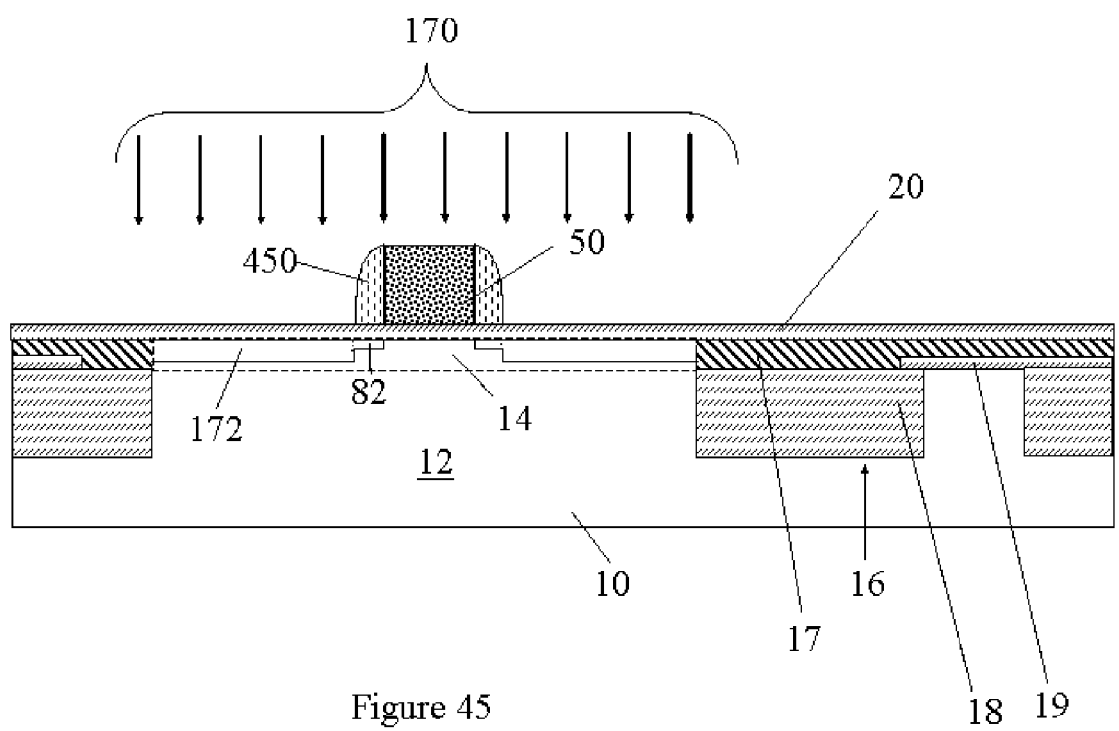
FIG. 45 is a schematic diagram of a partially completed bipolar transistor according to the invention.
Figure 46:
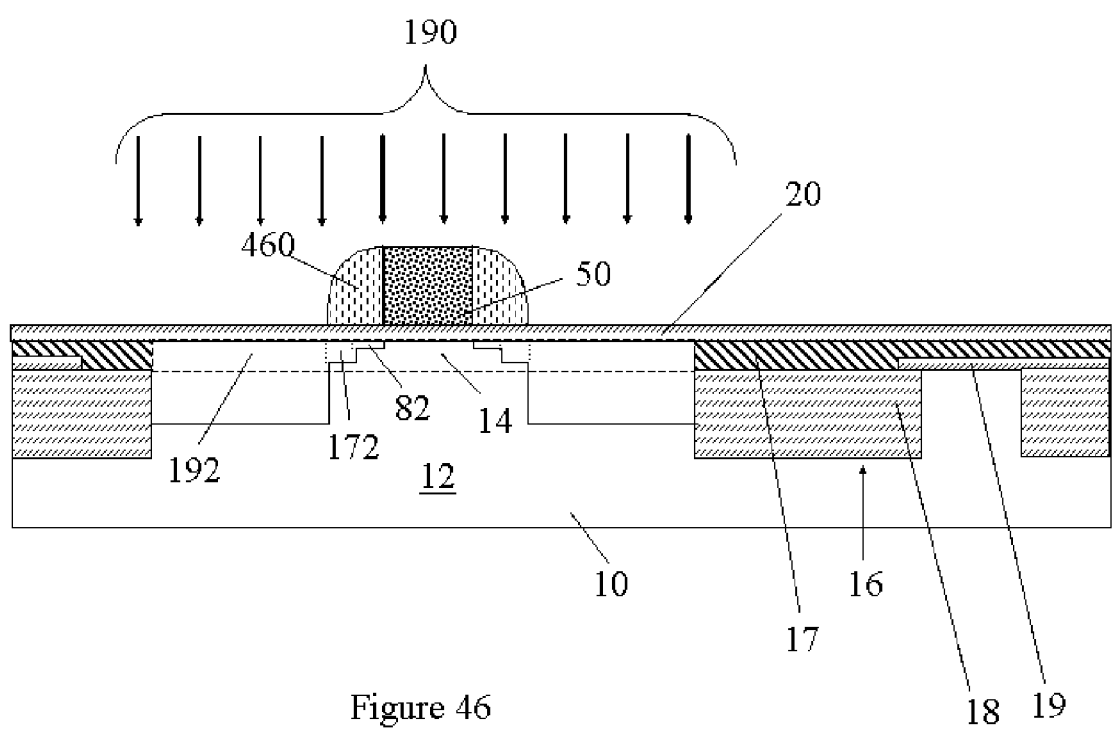
FIG. 46 is a schematic diagram of a partially completed bipolar transistor according to the invention.
Figure 47:
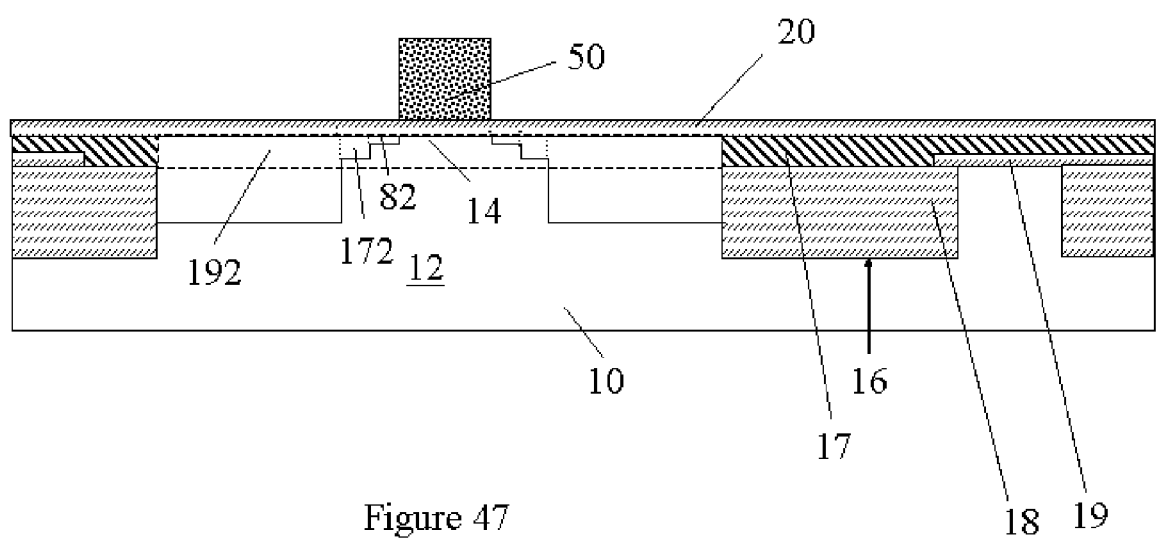
FIG. 47 is a schematic diagram of a partially completed bipolar transistor according to the invention.
Figure 48:
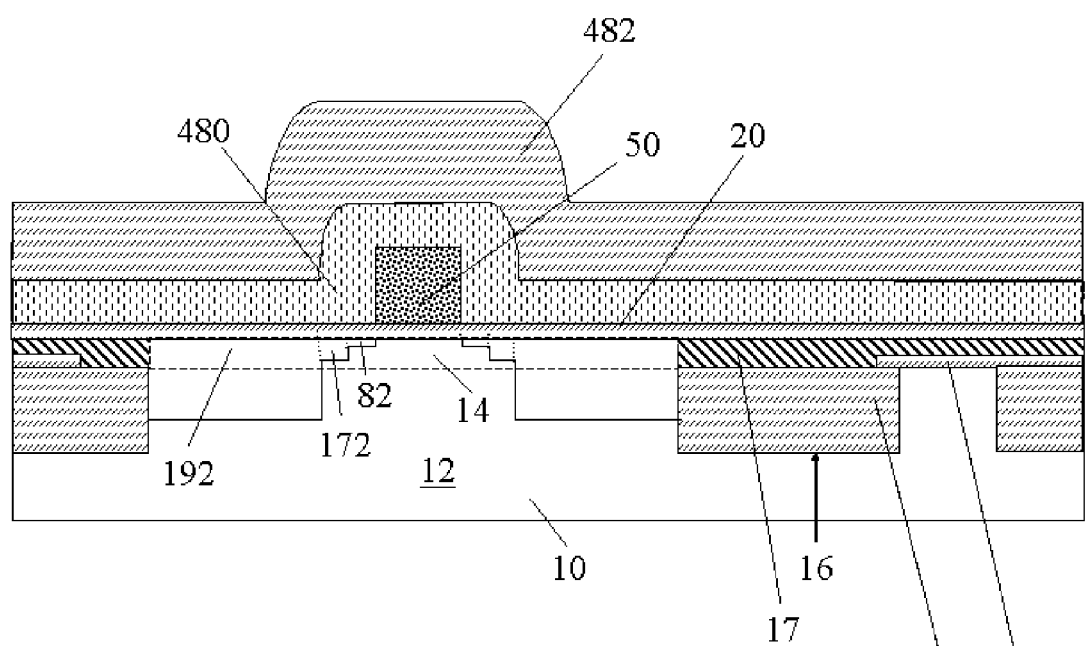
FIG. 48 is a schematic diagram of a partially completed bipolar transistor according to the invention.

Before forming the emitter or associated spacers, the invention forms an extrinsic base 82, 172, 192 in regions of the substrate 10 not protected by the emitter pedestal 50, as shown in FIGS. 44-46. The invention provides a process of forming the extrinsic base 82, 172, 192 that first performs a first impurity implant 80 into the regions of the substrate 10 not protected by the emitter pedestal 50, without any spacer present, to form the initial portion of the extrinsic base 82, as shown in FIG. 44. This allows the sides of the initial portion of the extrinsic base 82 to be directly vertically below and directly vertically aligned with sides of the lower portion of the emitter 130 (FIG. 55) that will eventually replace the emitter pedestal 50.

After this first implant 80, the invention then forms first sidewall spacer 54 on the emitter pedestal 50 and performs a second impurity implant 170 into regions of the substrate 10 not protected by the emitter pedestal 50 or the first sidewall spacer 450, as shown FIG. 45. The invention then removes the first sidewall spacer 54 and repeats the implant process with a wider sidewall spacer 460, as shown FIG. 46. More specifically, the invention forms second sidewall spacer 460 on the emitter pedestal 50. The second sidewall spacer 460 extends further from the emitter pedestal 50 than did the first sidewall spacer 450. Then, the invention performs a third impurity implant 190 into regions of the substrate 10 not protected by the emitter pedestal 50 or the second sidewall spacer 460. After this, and shown FIG. 47, the second sidewall spacer 460 is removed.

As shown in FIG. 46, this processing causes the extrinsic base 82, 172, 192 to include multiple steps 82, 172, 192 adjacent the intrinsic base 14, when viewed in cross-section. These steps are also referred to herein as a retrograde doping profile. These steps comprise lengths of the extrinsic base 82, 172, 192 that extend different depths into the substrate 10, wherein each successive length of the extrinsic base 82, 172, 192 away from the intrinsic base 14 extend further (deeper) into the substrate 10. The intrinsic base 14 has a shape that mirrors the multiple step shape of the extrinsic base 82, 172, 192.

One of the benefits of this aspect of the invention is that the thicknesses of the first sidewall spacer 450 and the second sidewall spacer 460 are independent of the thickness of the isolation regions 20, 480 (shown in FIG. 57) that will be formed adjacent the lower portion of the emitter 130 later. Therefore, unlike conventional methodologies, with the invention the dimensions of the steps in the extrinsic base 82, 172, 192 is completely independent of the spacer or isolation regions that will be formed next to the lower portion of the emitter 130. Thus, the invention can position the edges of the extrinsic base wherever necessary to optimize the performance of the transistor, without regard to the dimensions of the isolation regions 20, 480 that will be positioned adjacent to the lower portion of the T-shaped emitter 130.

Figure 49:
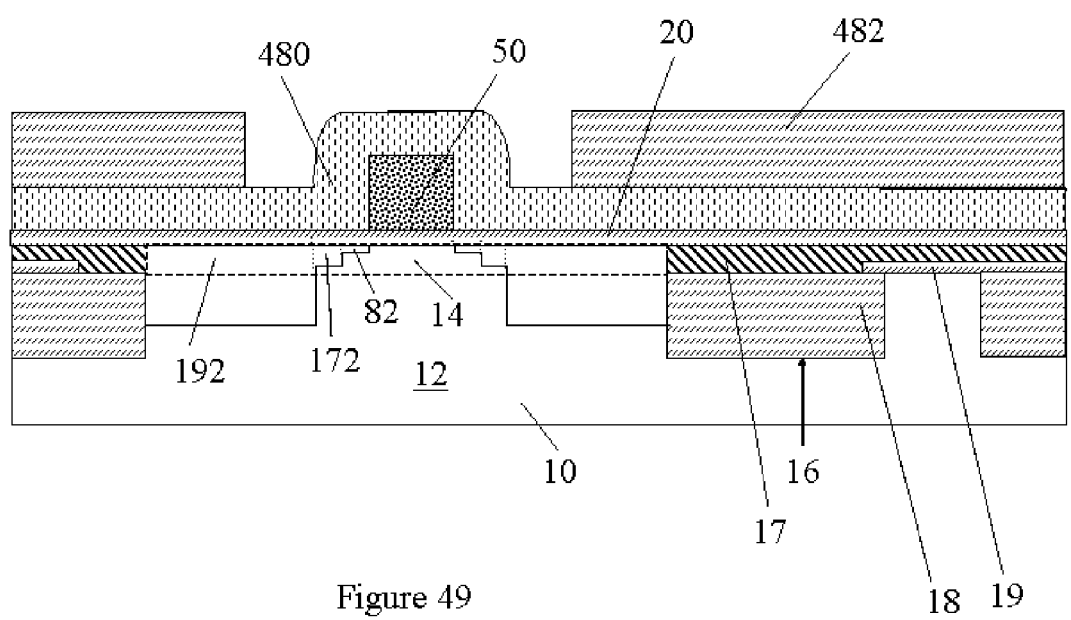
FIG. 49 is a schematic diagram of a partially completed bipolar transistor according to the invention.
Figure 50:
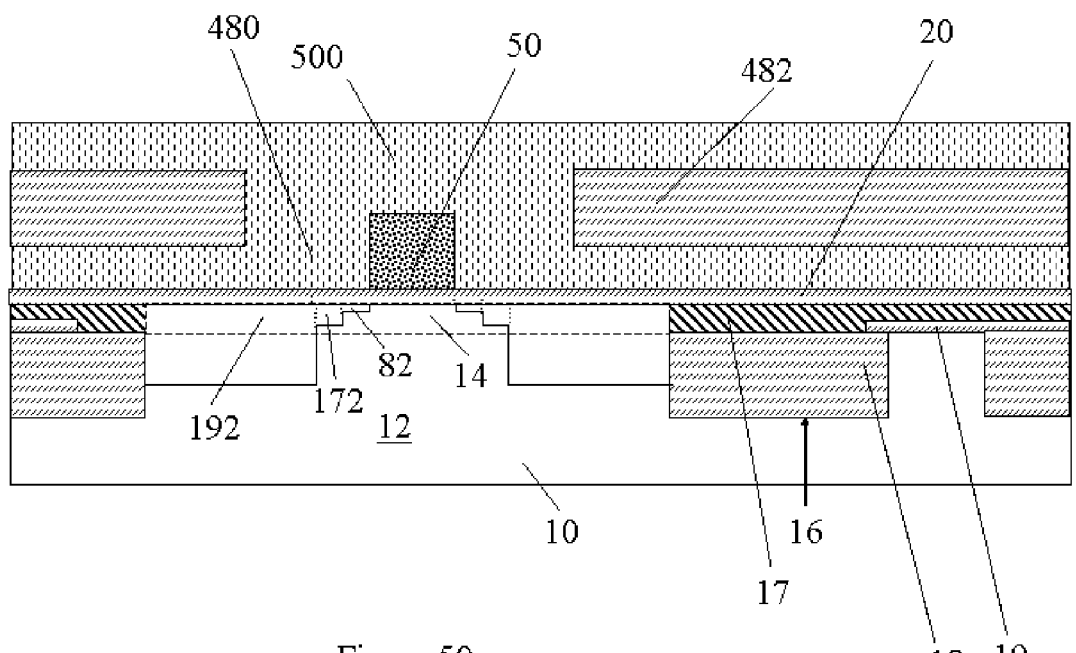
FIG. 50 is a schematic diagram of a partially completed bipolar transistor according to the invention.
Figure 51:
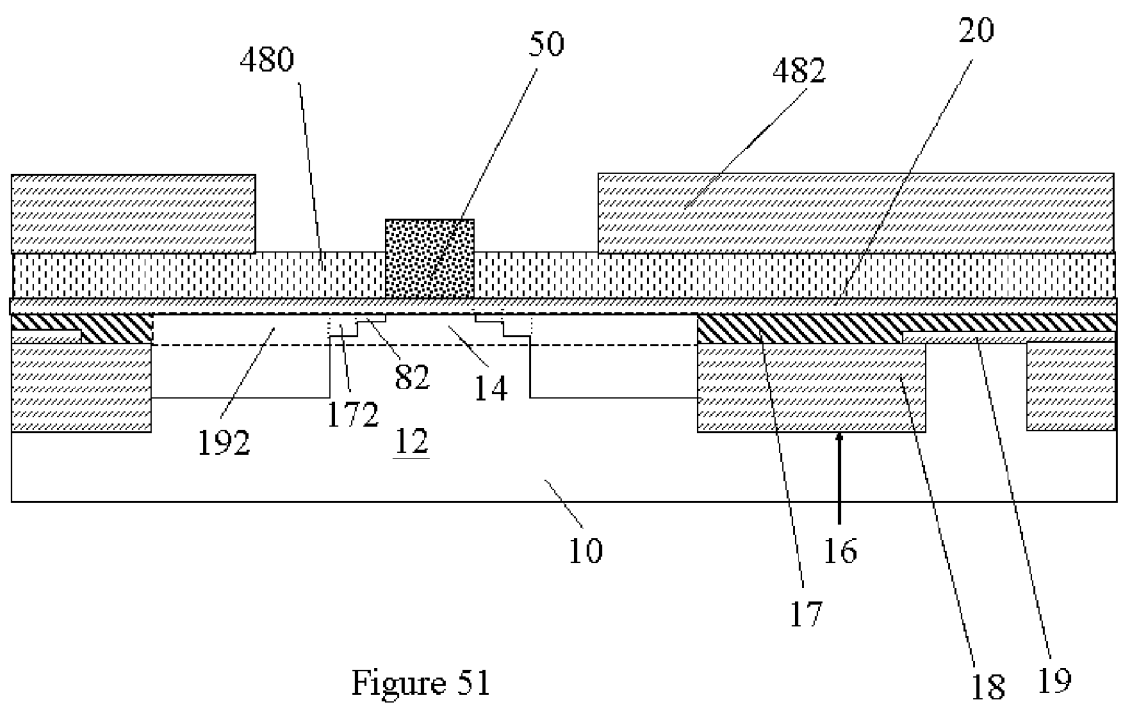
FIG. 51 is a schematic diagram of a partially completed bipolar transistor according to the invention.
Figure 52:
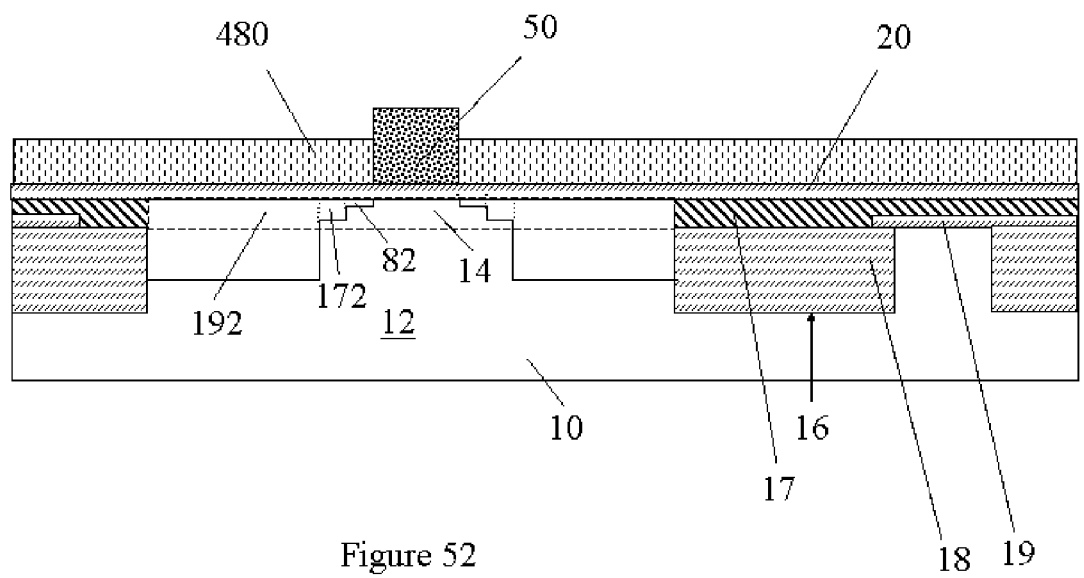
FIG. 52 is a schematic diagram of a partially completed bipolar transistor according to the invention.
Figure 53:
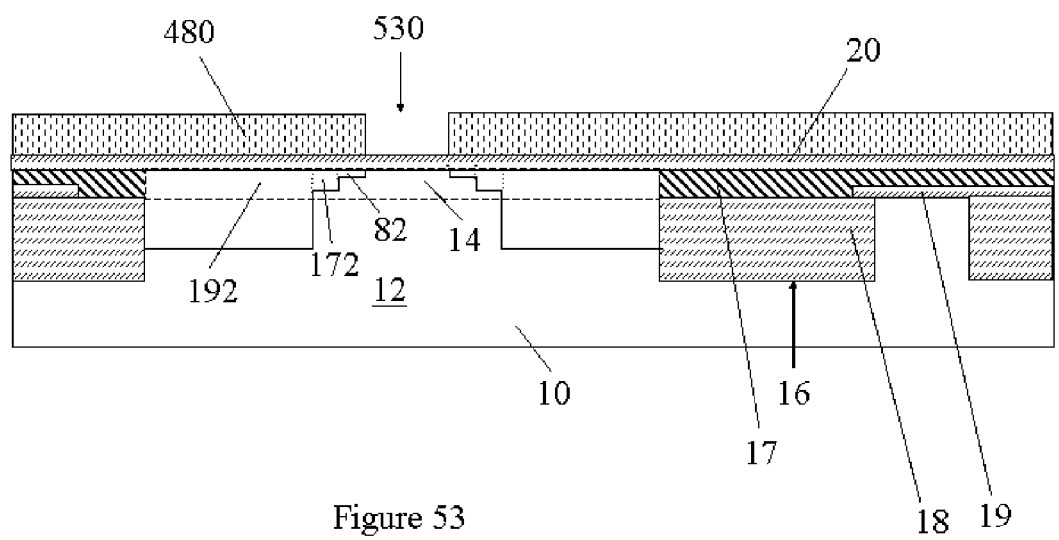
FIG. 53 is a schematic diagram of a partially completed bipolar transistor according to the invention.
Figure 54:
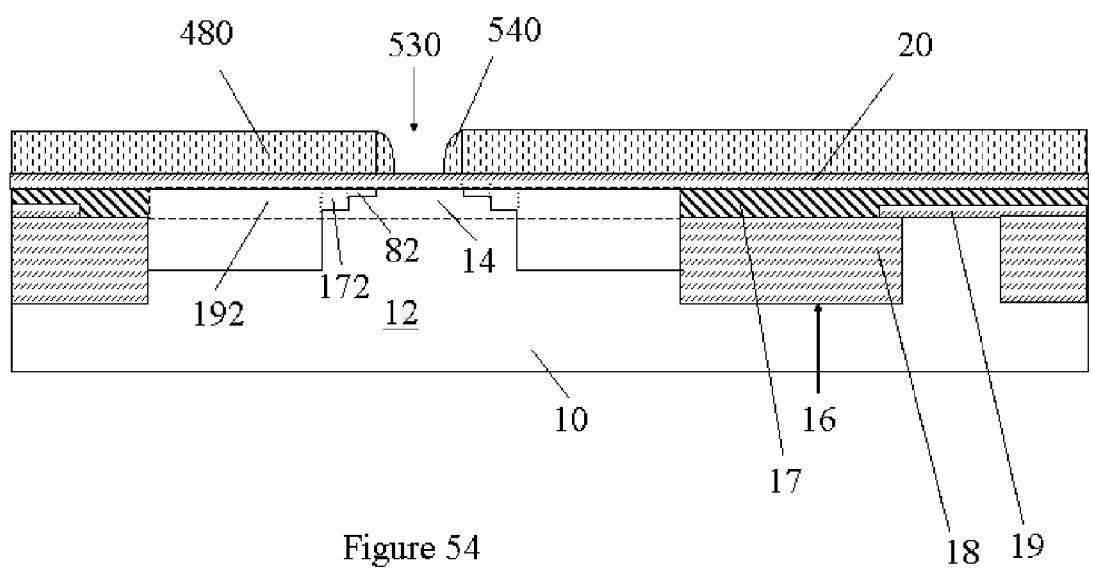
FIG. 54 is a schematic diagram of a partially completed bipolar transistor according to the invention.
Figure 55:
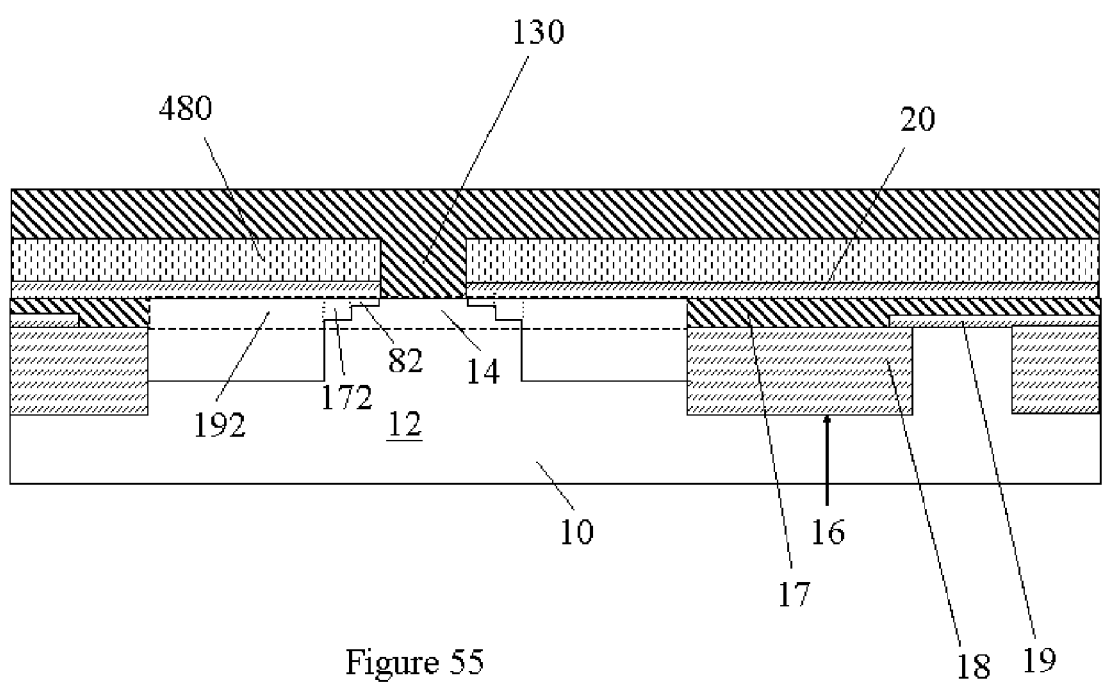
FIG. 55 is a schematic diagram of a partially completed bipolar transistor according to the invention.
Figure 56:
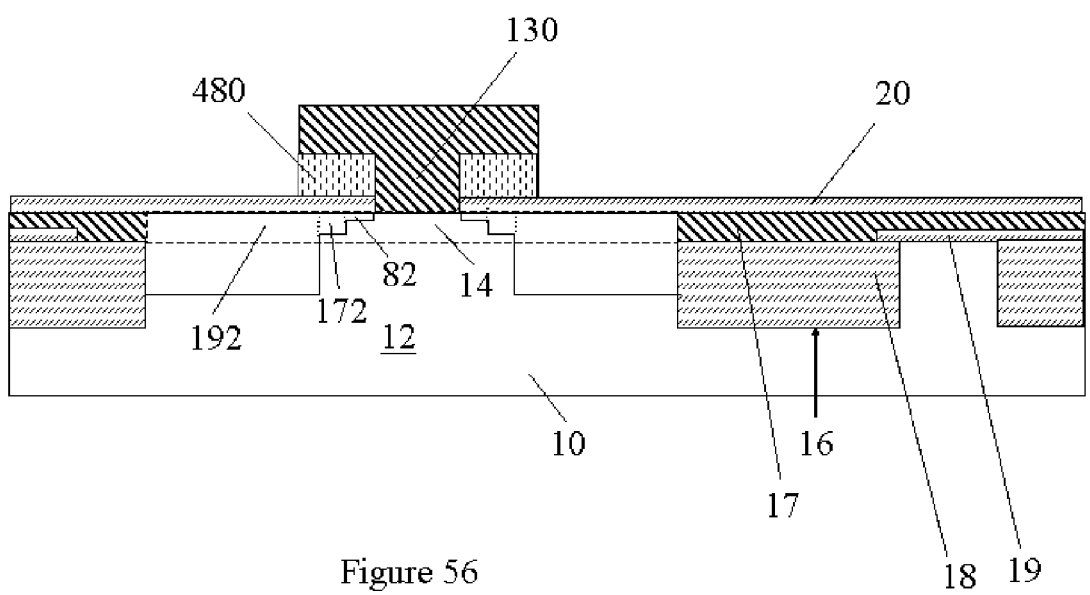
FIG. 56 is a schematic diagram of a partially completed bipolar transistor according to the invention.
Figure 57:
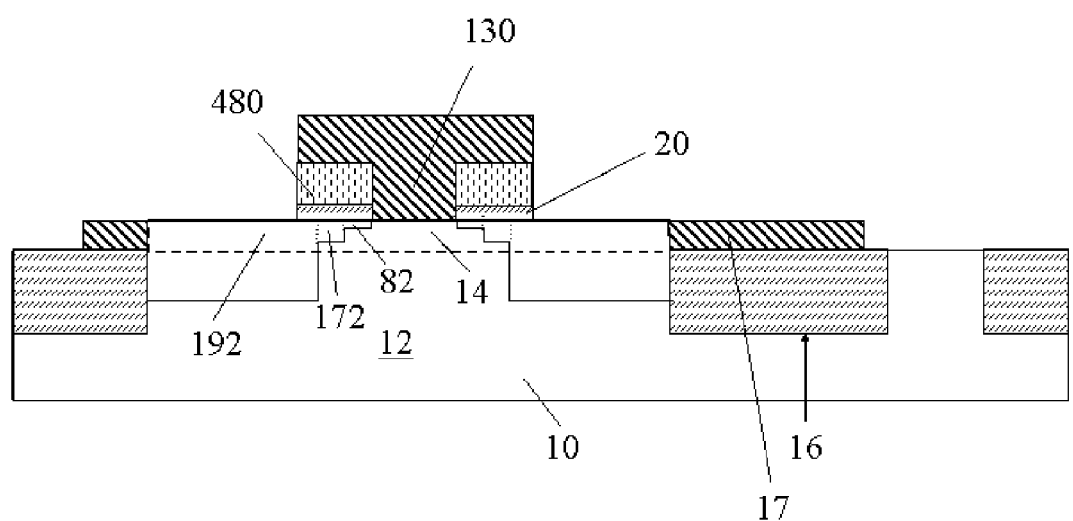
FIG. 57 is a schematic diagram of a partially completed bipolar transistor according to the invention.

In FIGS. 48-53, the invention prepares a layer 480 for the emitter 130 that will be formed in FIG. 55. More specifically, in FIG. 48 conformal nitride 480 and oxide 482 layers are formed over the structure. In FIG. 49, the oxide layer 482 is patterned to expose a portion of the nitride layer 480. Next, in FIG. 50, additional nitride is added to the previous nitride layer 480 to form a thicker nitride layer 500. In FIG. 51, the nitride 480, 500 is etched down to a level below the top of the emitter pedestal 50. Then, in FIG. 52, the oxide layer 482 is removed. Finally, in FIG. 53, the emitter pedestal 50 is removed leaving opening 530. FIG. 54 illustrates an optional embodiment that forms sidewall spacer 540 on the sidewalls of layer 480. If this sidewall spacer 540 is utilized, when the emitter 130 is formed, it will be spaced from the side of the extrinsic base 82, 172, 192. In this description, the "side" of the extrinsic base is the vertical portion of region 482 that it is adjacent to the intrinsic base 14. Therefore, these optional sidewall spacer 540 can be used, when necessary, to provide additional control regarding the horizontal spacing between the side of the extrinsic base 82, 172, 192 and the sides of the lower portion of the T-shaped emitter structure 130. The various material deposition and removal processes that are discussed above are well known to those ordinarily skilled in the art and will vary depending upon which materials are used in the specific design, and a detailed discussion of the same is avoided herein for brevity.

Thus, as shown above, before the invention removes the emitter pedestal 50, it forms a layer 480 adjacent the emitter pedestal 50. When the emitter pedestal 50 is removed, this leaves an emitter opening 530 in the layer 480. Note that the position of the emitter opening 530 in the layer 480 is completely self aligned by previously formed structures and does not require any lithographic-type structures, which avoids many problems of conventional methodologies.

As shown in FIG. 55, the invention forms the T-shaped emitter 130 where the emitter pedestal 50 was positioned. Once again, one ordinarily skilled in the art would understand that the emitter 130 can be formed of many useful conductors, such as polysilicon. Next, in FIG. 56, the exposed portion of layer 480 is removed, and in FIG. 57, the exposed portion of the etch stop layer 20 is removed. These processing steps form isolation regions 20, 480 that isolates the emitter 130 from the extrinsic base 82, 172, 192.

In this embodiment, the sides of the extrinsic base region 82 are directly vertically below and directly horizontally aligned with the sides of a lower portion of the emitter 130 that is directly above the intrinsic base 14. Thus, the top of the intrinsic base 14 has the same width as the lower section of the emitter 130 and the extrinsic base regions 14 do not extend below the lower portion of the emitter 130.

Therefore, as shown above, in this embodiment, the lateral dimension of the transistor is reduced by maximizing the use of self-alignment. The extrinsic base 82, 172, 192 is partially implanted prior to the polysilicon emitter 130 formation to form a doping profile in proximity of the emitter-base junction. Thus, with the invention, the emitter polysilicon 130 pattern is self-aligned to the emitter opening 130 and the extrinsic base implant 82, 172, 192. Further, the temporary emitter pedestal 50 lays on the thin etch stop layer 20 which allows for low energy ion implantation, which provides better control of the extrinsic base doping profile depth and lateral diffusion. The use of the disposable pedestal 50 to form the extrinsic base 82, 172, 192 doping allows for an optimum profile that is independent of other structures of the transistor such as emitter-base isolation regions 20, 100.

While the invention has been described in terms of preferred embodiments, those skilled in the art will recognize that the invention can be practiced with modification within the spirit and scope of the appended claims.

What is claimed is:

1. A bipolar transistor comprising:
   a substrate;
   a collector in said substrate;
   an intrinsic base above said collector;
   an extrinsic base adjacent to said intrinsic base, wherein, on at least one side of said intrinsic base, said extrinsic base comprises multiple extrinsic base implant regions comprising at least:
      a first implant region adjacent to said intrinsic base and having a first depth; and
      a second implant region adjacent to said first implant region and having a second depth that is greater than said first depth;
   an emitter comprising:
      a lower portion above said intrinsic base and having a first sidewall; and
      an upper portion above said lower portion and having a second sidewall,
         wherein said upper portion is wider than said lower portion such that a section of said upper portion extends laterally beyond said first sidewall and
         wherein said first implant region is aligned below said section from said first sidewall of said lower portion to said second sidewall of said upper portion; and
   a sidewall spacer adjacent to said second sidewall, wherein said sidewall spacer is above said second implant region and wherein a step from said first depth of said first implant region to said second depth of said second implant region is aligned with said second sidewall.

2. The bipolar transistor in claim 1, wherein the top of said intrinsic base has the same width as said lower portion of said emitter that is directly above said intrinsic base.

3. The bipolar transistor in claim 1, wherein said extrinsic base implant regions do not extend below said lower portion of said emitter that is directly above said intrinsic base.

4. The bipolar transistor in claim 1, wherein an implant region farther from said intrinsic base extends deeper into said substrate than another implant region closer to said intrinsic base.

5. The bipolar transistor in claim 1, wherein a length of said second implant region is independent of the size of said sidewall spacer.

6. A bipolar transistor comprising:
a substrate;
a collector in said substrate;
an intrinsic base in said substrate above said collector;
an extrinsic base in said substrate adjacent to said intrinsic base, wherein on at least one side of said intrinsic base said extrinsic base comprises multiple extrinsic base implant regions comprising at least:
a first implant region adjacent to said intrinsic base and having a first depth; and
a second implant region adjacent to said first implant region and having a second depth that is greater than said first depth;
an emitter comprising:
a lower portion above said intrinsic base and having a first sidewall; and
an upper portion above said lower portion and having a second sidewall,
wherein said upper portion is wider than said lower portion such that a section of said upper portion extends laterally beyond said first sidewall and
wherein said first implant region is aligned below said section from said first sidewall of said lower portion to said second sidewall of said upper portion;
a sidewall spacer adjacent to said second sidewall, wherein said sidewall spacer is above said second implant region and wherein a step from said first depth of said first implant region to said second depth of said second implant region is aligned with said second sidewall; and
suicide regions above said extrinsic base and said emitter, wherein said suicide regions, said extrinsic base, and said emitter are all self-aligned with each other.

7. The bipolar transistor in claim 6, wherein the top of said intrinsic base has the same width as said lower portion of said emitter.

8. The bipolar transistor in claim 6, wherein said extrinsic base implant regions do not extend below said lower portion of said emitter.

9. The bipolar transistor in claim 6, wherein an implant region farther from said intrinsic base extends deeper into said substrate than another implant region closer to said intrinsic base.

10. The bipolar transistor in claim 6, wherein a length of said said second implant region is independent of the size of said sidewall spacer.

11. A bipolar transistor comprising:
a substrate;
a collector in said substrate;
an intrinsic base in said substrate above said collector;
a t-shaped emitter above said intrinsic base, wherein said t-shaped emitter comprises:
a lower portion having a first sidewall; and
an upper portion above said lower portion and having a second sidewall,
wherein said upper portion is wider than said lower portion such that a section of said upper portion extends laterally beyond said first sidewall;
an extrinsic base in said substrate adjacent to said intrinsic base, wherein on at least one side of said intrinsic base said extrinsic base comprises:
a first implant region adjacent to said intrinsic base and extending into said substrate a first depth, wherein said first implant region is aligned below said section from said first sidewall of said lower portion to said second sidewall of said upper portion;
a second implant region adjacent to said first implant region and extending into said substrate a second depth; and,
a third implant region adjacent to said second implant region and extending into said substrate a third depth, wherein said implant regions are stepped such that said third depth is greater than said second depth and said second depth is greater than said first depth;
a sidewall spacer adjacent to said second sidewall, wherein said sidewall spacer is above said second implant region and wherein a step from said first depth of said first implant region to said second depth of said second implant region is aligned with said second sidewall; and
a silicide region above said emitter that is aligned with said second side.

12. The bipolar transistor in claim 11, wherein the top of said intrinsic base has the same width as said lower portion.

13. The bipolar transistor in claim 11, wherein said extrinsic base implant regions do not extend below said lower portion.

14. The bipolar transistor in claim 11, wherein stepped extrinsic base implant regions optimize base resistance and emitter-base leakage current.

* * * * *